United States Patent [19]

Otani et al.

[11] Patent Number: 5,786,612
[45] Date of Patent: Jul. 28, 1998

[54] SEMICONDUCTOR DEVICE COMPRISING TRENCH EEPROM

[75] Inventors: Naoko Otani; Toshiharu Katayama, both of Tokyo, Japan

[73] Assignee: Mitsubishi Denki Kabushiki Kaisha, Tokyo, Japan

[21] Appl. No.: 633,093

[22] Filed: Apr. 16, 1996

[30] Foreign Application Priority Data

Oct. 25, 1995 [JP] Japan ................................. 7-277588

[51] Int. Cl.⁶ .......................................... H01L 21/8247
[52] U.S. Cl. ............................ 257/316; 257/318; 257/322
[58] Field of Search .................................. 257/316, 317, 257/318, 322, 326, 331

[56] References Cited

U.S. PATENT DOCUMENTS

| 4,571,512 | 2/1986 | Schutten et al. | 257/331 |
|---|---|---|---|
| 4,612,465 | 9/1986 | Schutten et al. | 257/331 |
| 4,774,556 | 9/1988 | Fujii et al. | 257/303 |
| 4,786,953 | 11/1988 | Morie et al. | 257/331 |
| 4,890,144 | 12/1989 | Teng et al. | 257/331 |
| 4,929,988 | 5/1990 | Yoshikawa | 257/316 |
| 5,049,956 | 9/1991 | Yoshida et al. | 257/331 |
| 5,053,842 | 10/1991 | Kojima | 257/316 |
| 5,146,426 | 9/1992 | Mukherjee et al. | 257/316 |
| 5,258,634 | 11/1993 | Yang | 257/316 |
| 5,338,953 | 8/1994 | Wake | 257/315 |
| 5,350,937 | 9/1994 | Yamazaki et al. | 257/331 |
| 5,411,905 | 5/1995 | Acovic et al. | 437/43 |
| 5,414,287 | 5/1995 | Hong | 257/331 |
| 5,576,567 | 11/1996 | Mori | 257/331 |
| 5,606,521 | 2/1997 | Kuo et al. | 365/149 |
| 5,616,510 | 4/1997 | Wong | 438/259 |

FOREIGN PATENT DOCUMENTS

| 1-291470 | 11/1989 | Japan. | |
|---|---|---|---|
| 402039473 | 2/1990 | Japan | 257/331 |
| 3-1574 | 1/1991 | Japan. | |
| 3-1574(A) | 1/1991 | Japan. | |
| 4-79369 | 3/1992 | Japan. | |
| 4-267374 | 9/1992 | Japan. | |

*Primary Examiner*—Donald Monin
*Attorney, Agent, or Firm*—McDermott, Will & Emery

[57] ABSTRACT

Each of source regions (4) is provided only immediately below a bottom surface (3B) of each of trenches (3) which is formed in a silicon substrate (1), extending inward from a main surface (1S) thereof along a second direction, and each of gate electrode portions (23) is provided inside each of the trenches (3). Specifically, each of the gate electrode portions (23) consists of a gate oxide film (19) formed on a side surface (S1) and part of the bottom surface (3B) of the trench (3), an FG electrode (20) formed thereon, a gate insulating film (21) formed on a side surface of the FG electrode (20) which is out of contact with the gate oxide film (19), an upper surface of the FG electrode (20), a side surface (2S) and the other part of the bottom (3B) of the trench (3), and a CG electrode (22) formed so as to cover an upper surface of the gate insulating film (21). Each of drain regions (11) is shared by the two adjacent transistors. The device configuration as above achieves reduction in area of the gate electrode portions (23) and further reduction in each level difference between both regions having and not having the gate electrode portion (23). Thus, reduction in level difference of each memory cell is achieved while reduction in area of each memory cell is ensured.

6 Claims, 24 Drawing Sheets

SEMICONDUCTOR DEVICE COMPRISING TRENCH EEPROM

BACKGROUND OF THE INVENTION

1. Field of the Invention

The present invention relates to a semiconductor memory device, more particularly to a nonvolatile semiconductor memory device which is electrically erasable and programmable, and a method of manufacturing the same.

2. Description of the Background Art

One of the nonvolatile semiconductor memory devices known well in the background art is an EEPROM (Electrically Erasable and Programmable Read Only Memory).

FIG. 43 is a sectional view of a structure of the known EEPROM. In this figure, reference character 1P represents a silicon substrate 1P, and each of drain impurity diffusion layers 33 including an impurity of a conductivity type opposite to that of the silicon substrate 1P and a source impurity diffusion layer 34 including an impurity of a conductivity type opposite to that of the silicon substrate 1P are formed in the silicon substrate 1P. Contact impurity diffusion layers 38 are formed below contact holes 37 which will be discussed later. Each of gate electrode portions 32 consists of a first gate oxide film 28 formed on the silicon substrate 1P, a floating gate electrode 29 formed on the first gate oxide film 28, a second gate insulating film 30 formed on the floating gate electrode 29 and a control gate electrode 31 formed on the second gate insulating film 30.

Furthermore, an interlayer underlying oxide film 35 is formed on the silicon substrate 1P and the gate electrode portions 32, an interlayer insulating film 36 is formed on the interlayer underlying oxide film 35 and each of the contact holes 37 opens a portion of the interlayer insulating film 36 and the corresponding portion of the interlayer underlying oxide film 35. An aluminum wire layer 39 is connected to the drain impurity diffusion layers 33 through the contact holes 37 and the contact impurity diffusion layers 38. A passivation film 17P is formed in a region for device formation on the silicon substrate 1P.

In this EEPROM, a pair of memory transistors share a source electrode portion, i.e., source impurity diffusion layer 34 and adjacent pairs of memory transistors share a drain electrode portion.

Referring to FIG. 43, an operation of the EEPROM will be now discussed. The operation modes of the EEPROM includes a write/erase mode for electrically writing or erasing information and a read mode for reading information. Further, the write/erase mode includes a write mode for electrically writing information and an erase mode for electrically erasing information.

In the erase mode, for example, the drain electrode portion including the drain impurity diffusion layer 33 is brought into a floating state, and the control gate electrode 31 is brought into a ground state. Then, a high voltage of e.g., about 12 V, is applied to the source electrode portion including the source impurity diffusion layer 34, which causes Fowler-Nordheim tunnelling current (referred to as "FN tunnelling current" hereinafter) to be passed from the source impurity diffusion layer 34 to the floating gate electrode 29 through a portion of the first gate oxide film 28 on the side of the source electrode located below an end of the floating gate electrode 29 in the vicinity of the source impurity diffusion layer 34. This FN tunnelling current draws electrons out of the floating gate electrode 29, thus erasing information.

In the write mode, the source electrode portion including the source impurity diffusion layer 34 is brought into a ground state, and then a voltage of e.g., about 7 V is applied to the drain electrode portion including the drain impurity diffusion layer 33 and a high voltage of e.g., about 12 V is applied to the control gate electrode 31. In this state, an avalanche phenomenon occurs in the vicinity of a portion of the drain impurity diffusion layer 33 located below the end of floating gate electrode 29. Hot electrons induced by the avalanche phenomenon are injected into the floating gate electrode 29 from the silicon substrate 1P through a portion of the first gate oxide film 28 on the side of the drain electrode, thus writing information.

In the read mode, the source electrode portion including the source impurity diffusion layer 34 is brought into a ground state, and then a voltage of e.g., about 1 V is applied to the drain electrode portion including the drain impurity diffusion layer 33 and a voltage of e.g., about 3 V is applied to the control gate electrode 31. In this state, a level of state, "1" or "0", is determined depending on whether a current of prescribed value Ids or more flows or not, to read information.

Specifically, when the electrons exist in the floating gate electrode 29, no current flows from the drain impurity diffusion layer 33 to the source impurity diffusion layer 34, thus reading a writing state, in other words, the level of "0". On the other hand, when the electrons have been already drawn out of the floating gate electrode 29, a current of prescribed value Ids or more flows from the drain impurity diffusion layer 33 to the source impurity diffusion layer 34, thus reading an erasing state, in other words, the level of "1".

Referring next to FIGS. 43 to 51, a method of manufacturing the known nonvolatile semiconductor memory device will be discussed step by step.

The process starts with formation of a field oxide film (not shown) having a thickness of about 400 nm by well-known means in a region for device isolation of the silicon substrate 1P. The first gate oxide film 28 having a thickness of about 10 nm is formed on the silicon substrate 1P by means of a thermal oxidation technique, as shown in FIG. 44. A polycrystalline polysilicon layer having a thickness of about 200 nm to be processed into the floating gate electrode 29 is formed on the first gate oxide film 28, and then the second gate insulating film 30 having a thickness of about 30 nm and a polycrystalline polysilicon layer having a thickness of about 300 nm to be processed into the control gate electrode 31 are sequentially formed thereon, as shown in FIG. 45. The respective layers are processed to have desired patterns by means of well-known photolithographic and etching techniques, thus obtaining the gate electrode portion 32 consisting of the first gate oxide film 28, the floating gate electrode 29, the second gate insulating film 30 and the control gate electrode 31, as shown in FIG. 46.

As shown in FIG. 47, an implantation with As ion at a dose of about $3 \times 10^{15}/cm^2$ into the silicon substrate 1P is carried out, utilizing the gate electrode portions 32 as masks. After that, the implanted impurities are diffused by means of a thermal diffusion technique, thereby forming the source impurity diffusion layer 34 and the drain impurity diffusion layers 33.

The interlayer underlying oxide film 35 is formed on the gate electrode portions 32 and portions of the silicon substrate 1P having no gate electrode portion 32, as shown in FIG. 48. The whole device region is thereafter covered with the interlayer insulating film 36, as shown in FIG. 49. Each opening is formed in respective portions of the interlayer insulating film 36 and the interlayer underlying oxide film 35 located above the corresponding drain impurity diffusion layer 33, thus obtaining the contact holes 37, as shown in FIG. 50.

Next, impurities of a conductivity type opposite to that of the silicon substrate 1P are implanted into the silicon substrate 1P by means of an ion implantation technique through the contact holes 37 to form the contact impurity diffusion layers 38 for preventing penetration of the aluminum into the silicon substrate 1P. The aluminum wire layer 39 having a thickness of about 1 μm which is to serve as bit lines is formed and electrically connected to the drain impurity diffusion layers 33. After that, the passivation film 17P having a thickness of about 1 μm for device protection is formed, as shown in FIG. 43, thus completely achieving a chip.

The known semiconductor device of FIG. 43 has a stacked memory cell structure in which the control gate electrode is stacked on the floating gate electrode. For this reason, there arises a structural problem of large level difference between both regions having and not having the gate electrode in a memory transistor. The depth of the contact hole increases by the stacked floating gate and control gate. As the result, manufactural problems, such as defocus in photolithography process and a break in the aluminum wire layer, are liable to be caused and accordingly it is difficult to obtain a configuration of preferable property. A great level difference, especially, causes a difference in etching speed, thereby increasing unevenness in film thickness of the formed films.

Moreover, there exists a problem of increasing an area of each cell since the source and drain regions are formed on both sides of the memory transistor.

As to the latter problem, proposed techniques for improvement are shown in ① Japanese Patent Application Laid-Open Gazette 3-1574, ② Japanese Patent Application Laid-Open Gazette 4-267374, ③ Japanese Patent Application Laid-Open Gazette 1-291470 and so on. The techniques discussed in the documents ① to ③ surely contribute to reduction in cell area, but not to reduction in level difference. In a technique of the document ③, particularly, a deep contact hole disadvantageously makes it difficult to form the aluminum wire layer evenly in the contact hole and is liable to cause a break in a wire. In a technique of the document ②, a coupling ratio is disadvantageously reduced because of a tunnelling current produced in a large area. Therefore, it is not preferable to adopt the techniques shown in the documents ① to ③.

SUMMARY OF THE INVENTION

The present invention is directed to a semiconductor memory device. According to a first aspect of the present invention, the semiconductor memory device comprises: an underlying layer of a first conductivity type; a trench formed in the underlying layer, extending inward from a main surface of the underlying layer to a prescribed depth, having a prescribed width in a first direction of the main surface and extending along a second direction perpendicular to the first direction; a first impurity diffusion layer region of a second conductivity type formed at least under a bottom surface of the trench in the underlying layer; a first gate insulating film formed at least on a side surface of the trench along the second direction and a part of the bottom surface of the trench in a portion inside the trench located in a region for a gate electrode portion to be formed; a floating gate electrode formed so as to cover at least an upper surface of the first gate insulating film in the portion inside the trench located in the region for the gate electrode portion to be formed; a second gate insulating film formed at least on one side surface of the floating gate electrode along the second direction without coming into contact with the upper surface of the first gate insulating film, the other part of the bottom surface of the trench, the other side surface of the trench opposed to the one side surface and an upper surface of the floating gate electrode which is not opposed to the bottom surface of the trench in the portion inside the trench located in the region for the gate electrode portion to be formed; a control gate electrode formed at least on an upper surface of part of the second gate insulating film covering at least the one side surface of the floating gate electrode, the other part of the bottom surface of the trench and the other side surface of the trench in the portion inside the trench located in the region for the gate electrode portion to be formed; and a second impurity diffusion layer region of the second conductivity type formed in the underlying layer, extending inward from the main surface of the underlying layer, and being adjacent to the first gate insulating film.

According to a second aspect of the present invention, the semiconductor memory device comprises: a trench formed in an underlying layer, extending inward from a main surface of the underlying layer; a gate insulating film formed inside the trench so as to divide a space inside the trench in half; and two gate electrodes formed inside the trench so as to be opposed to each other with the gate insulating film therebetween.

The present invention is also directed to a method of manufacturing a semiconductor memory device. According to a third aspect of the present invention, the method comprises the steps of: forming a trench in an underlying layer of a first conductivity type so as to extend inward from a main surface of the underlying layer to a prescribed depth, with a prescribed width in a first direction of the main surface, along a second direction perpendicular to the first direction (the first step) and forming a first impurity diffusion layer region of a second conductivity type at least under a bottom surface of the trench in the underlying layer along the second direction (the second step); forming an insulating film for device isolation in a portion other than a portion inside the trench located in a region for a gate electrode portion to be formed (the third step); forming a first gate insulating film at least on one side surface along the second direction and part of the bottom surface of the trench in the portion inside the trench located in the region for the gate electrode portion to be formed and forming a floating gate electrode so as to cover an upper surface of the first gate insulating film (the fourth step); forming a second gate insulating film to cover at least an exposed surface of the floating gate electrode, the other part of the bottom surface of the trench and the other side surface which is opposed to the one side surface of the trench in the portion inside the trench located in the region for the gate electrode portion to be formed and forming a control gate electrode to cover an upper surface of part of the second gate insulating film provided on at least an exposed side surface of the floating gate electrode, the other part of the bottom surface and the other side surface of the trench (the fifth step); and forming a second impurity diffusion layer region of the second conductivity type in the underlying layer so as to extend inward from the main surface of the underlying layer and to be adjacent to the first gate insulating film (the sixth step).

An object of the present invention is to achieve reduction in level difference of a memory cell portion while ensuring reduction in area of the cell and large coupling ratio. Another object of the present invention is to simplify a method of manufacturing the device to achieve such structure.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Referring now to figures, the first preferred embodiment of the present invention will be discussed.

Figure 1:
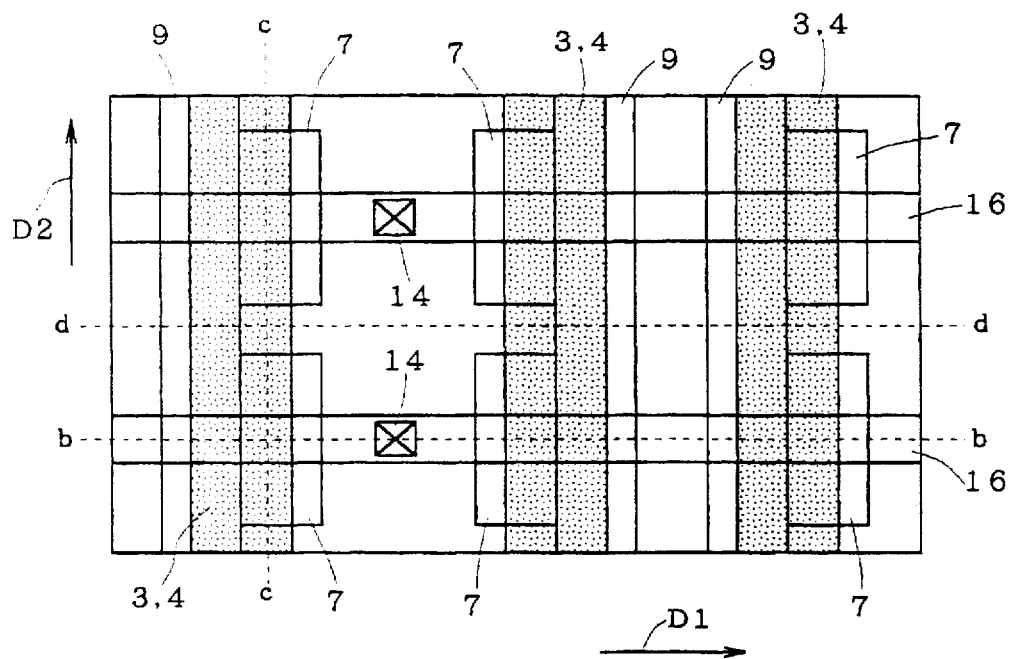
FIG. 1 is a plan view showing a structure of an EEPROM in accordance with a first preferred embodiment of the present invention.
Figure 2:
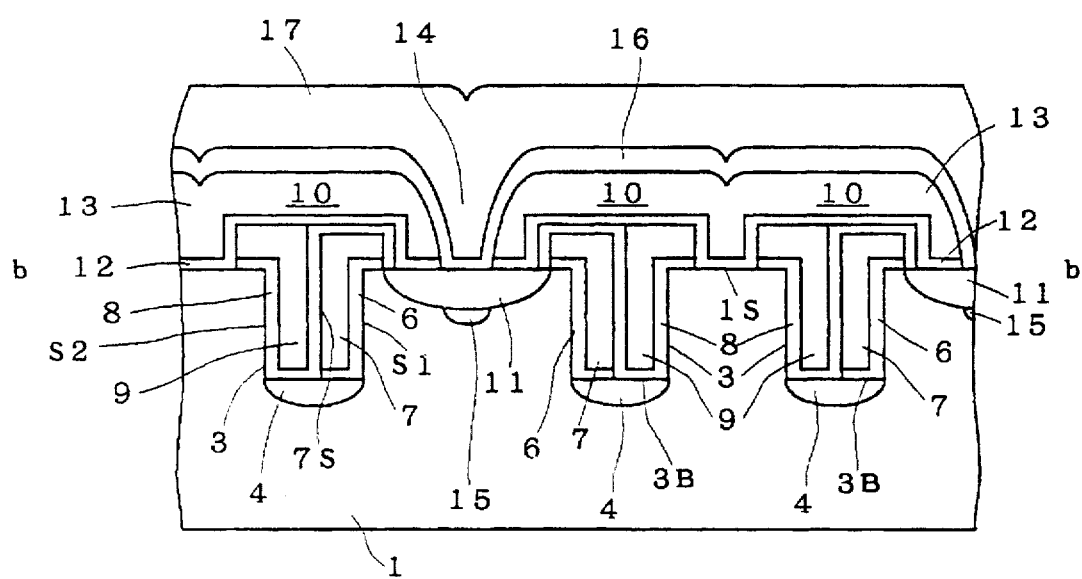
FIG. 2 is a sectional view showing the structure taken along the line b—b of the plan view of FIG. 1.
Figure 3:
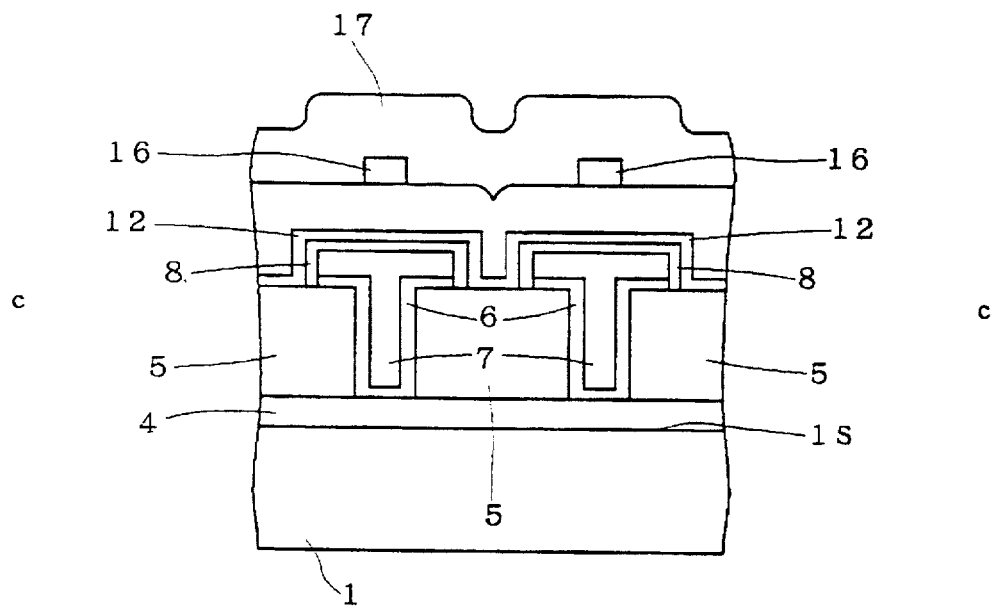
FIG. 3 is a sectional view showing the structure taken along the line c—c of the plan view of FIG. 1.
Figure 4:
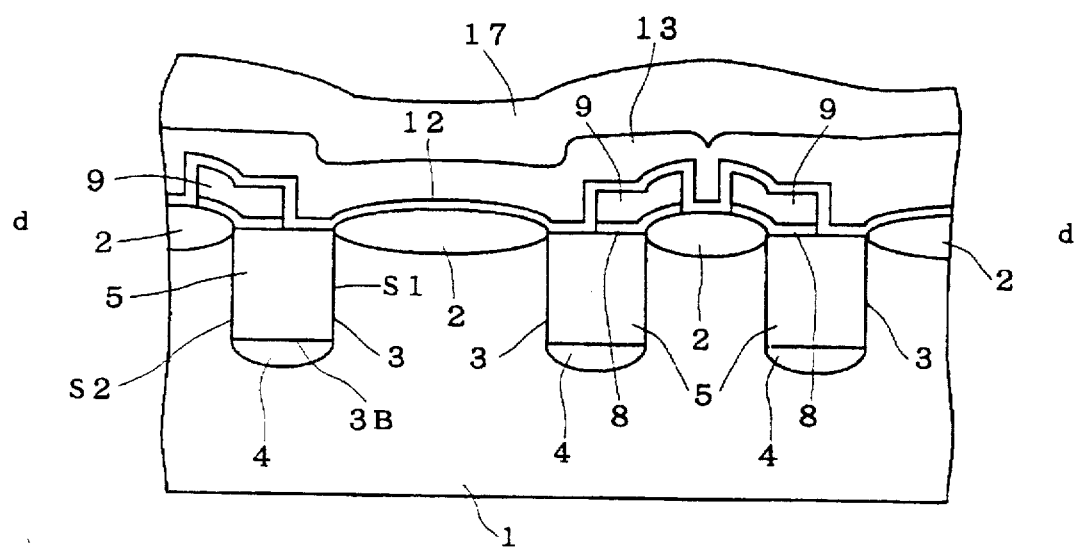
FIG. 4 is a sectional view showing the structure taken along the line d—d of the plan view of FIG. 1.

FIG. 1 is a plan view showing a structure of an EEPROM (Electrically Erasable and Programmable Read Only Memory) which is one of nonvolatile semiconductor memory devices. FIGS. 2, 3 and 4 are sectional views taken along the lines b—b, c—c and d—d of FIG. 1, respectively. In these figures, reference numeral 1 represents a silicon substrate (semiconductor substrate or underlying layer) of a first conductivity type, and field oxide films 2 are formed thereon to isolate memory cell regions from each other and trenches 3 are formed in the silicon substrate 1, extending inward from a main surface 1S of the silicon substrate 1 to a prescribed depth in the memory cell regions. Each of the trenches 3 has a prescribed width in the first direction D1 of the main surface 1S and extends along the second direction D2 of the main surface 1S perpendicular to the first direction D1. A source impurity diffusion layer 4 (source region or the first impurity diffusion layer region) including impurities of a second conductivity type opposite to that of the silicon substrate 1 is formed in a bottom portion or a bottom surface 3B of each of the trenches 3. An insulating film 5 for device isolation fills portions of each of the trenches 3 other than the memory cell region, or a region for gate electrode to be formed. In the memory cell region of each of the trenches 3, formed are a gate oxide film 6 (the first gate insulating film) serving as a tunnel oxide film, a floating gate (FG) electrode 7, a gate insulating film 8 (the second gate insulating film) consisting of an oxide film, or a nitride film and the like and a control gate (CG) electrode 9. Specifically, each of the gate oxide films 6 is formed on one side surface S1 along the second direction D2 of the corresponding trench 3, part of the main surface 1S and part of the bottom surface 3B. Each of the FG electrodes 7 is formed inside the trench 3 and over a portion of the main surface 1S located between the side surface S1 and an end of a drain region 11 which will be described later so as to cover the whole upper surface of the gate oxide film 6. Each of the gate insulating films 8 is formed on the whole upper surface of the FG electrode 7, the other part of the bottom surface 3B, the other side surface S2 and a portion of the main surface 1S. Each of the CG electrodes 9 is formed on a portion of an upper surface of the gate insulating film 8 which is formed on the side surface S2, the other part of the bottom surface 3B, the portion of the main surface 1S and one side surface 7S of the FG electrode 7 being out of contact with the gate oxide film 6, so as to be opposed to the FG electrode 7 with the gate insulating film 8 interposed therebetween inside the trench 3. Thus, each of the gate insulating films 8 is so formed as to divide the inner space of the trench 3 in half, and the gate electrodes 7 and 9 are opposed to each other with the gate insulating film 8 therebetween inside the trench 3.

Reference numeral 10 represents a gate electrode portion of a memory transistor, consisting of the films 6 and 8 and the electrodes 7 and 9.

Each of drain impurity diffusion layers 11 (drain region or the second impurity diffusion layer region) including impurities of the second conductivity type is formed in the silicon substrate 1 so as to be extended from the main surface 1S to the inside in the vicinity of the gate oxide film 6. An interlayer underlying oxide film 12 is formed on the main surface 1S of the silicon substrate 1 and over upper surfaces and side surfaces of the gate electrode portions 10 each of which is projected higher than the main surface 1S. An interlayer insulating film 13 is formed over an upper surface of the interlayer underlying oxide film 12. Each of contact holes 14 opens respective portions of the interlayer insulating film 13 and the interlayer underlying oxide film 12. Each of contact impurity diffusion layers 15 is formed in the silicon substrate 1, extending inward from a portion of a bottom surface of the drain impurity diffusion layer 11 located below the corresponding contact hole 14. Each of aluminum wire layers 16 is formed on a bottom surface and a side surface of the contact hole 14 and an upper surface of the interlayer insulating film 13, being connected to the drain impurity diffusion layer 11 through the contact hole 14 and the contact impurity diffusion layer 15. A passivation film 17 is formed on a region for device formation of the main surface 1S of the silicon substrate 1. Furthermore, the interlayer underlying oxide film 12 and the interlayer insulating film 13 are termed together "an interlayer insulating film".

In the above constitution, portions which primarily contribute to the level difference due to each of the gate electrode portions 10 are the projected parts of the FG electrode 7 and each of the CG electrodes 9 which are at a higher level than the main surface 1S by a prescribed height, and therefore the level differences are considerably reduced. Accordingly, the contact holes 14 become shallower than those in the background art, thereby ensuring a remarkably easy formation of the aluminum wire layer 16.

Referring next to FIG. 2, operations in the write/erase/read mode of any memory cell of the EEPROM will be discussed.

In the write mode, a source electrode including the source impurity diffusion layer 4 is brought into a ground state. Then, a positive voltage of e.g., 5 to 10 V is applied to a drain electrode including the drain impurity diffusion layer 11 and a positive voltage of e.g., 10 to 15 V is applied to the control gate electrode 9. In this state, an avalanche phenomenon occurs at a portion of the silicon substrate 1 in the vicinity of the drain impurity diffusion layer 11 immediately below an end of the floating gate electrode 7 which has an L-shaped section on the drain electrode side. Hot electrons induced by the avalanche phenomenon are injected into the floating gate electrode 7 from the silicon substrate 1 through a portion of the gate oxide film 6 located on the side of the drain electrode, thus writing information.

In the erase mode, both the drain electrode including the drain impurity diffusion layer 11 and the control gate electrode 9 are brought into a ground state. Then, a high positive voltage of e.g., 10 to 20 V is applied to the source electrode including the source impurity diffusion layer 4, which causes Fowler-Nordheim tunnelling current (referred to as "FN tunnelling current" hereinafter) to be passed from the source impurity diffusion layer 4 to the floating gate electrode 7 through a portion of the gate oxide film 6 located on the side of the source electrode, immediately below an end of the floating gate electrode 7 in the vicinity of an end of the source impurity diffusion layer 4. This FN tunnelling current draws electrons out of the floating gate electrode 7, thus erasing information.

In the read mode, the source electrode including the source impurity diffusion layer 4 is brought into a ground state, and then a positive voltage of e.g., about 1 V is applied to the drain electrode including the drain impurity diffusion layer 11 and a positive voltage of e.g., about 3 V is applied to the control gate electrode 9. In this state, a level of state, "1" or "0", is determined depending on whether a current of prescribed value or more flows or not, to read information. Specifically, when the electrons exist in the floating gate electrode 7, no current flows from the drain impurity diffusion layer 11 to the source impurity diffusion layer 4, thereby reading the level of "0". On the other hand, when there is no electron in the floating gate electrode 7, a current of prescribed value or more flows from the drain impurity diffusion layer 11 to the source impurity diffusion layer 4, thereby reading the level of "1".

The coupling ratio of the voltage applied to the FG electrode to the voltage at the source electrode increases since the interface area between the FG electrode 7 and source electrode 4 is small.

FIGS. 5 to 22 are sectional and plan views of the structure to illustrate a process of manufacturing the EEPROM shown in FIGS. 1 to 4. A method of manufacturing the EEPROM will be discussed below.

Figure 5:
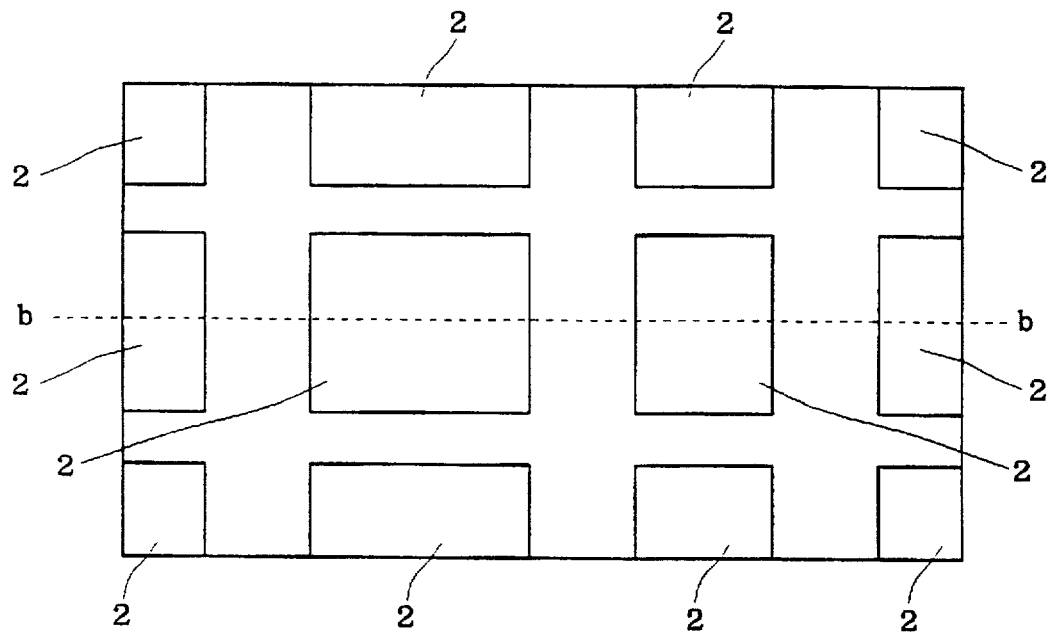
FIG. 5 is a plan view of the structure to illustrate the first step in a process of manufacturing the EEPROM of FIG. 1.
Figure 6:
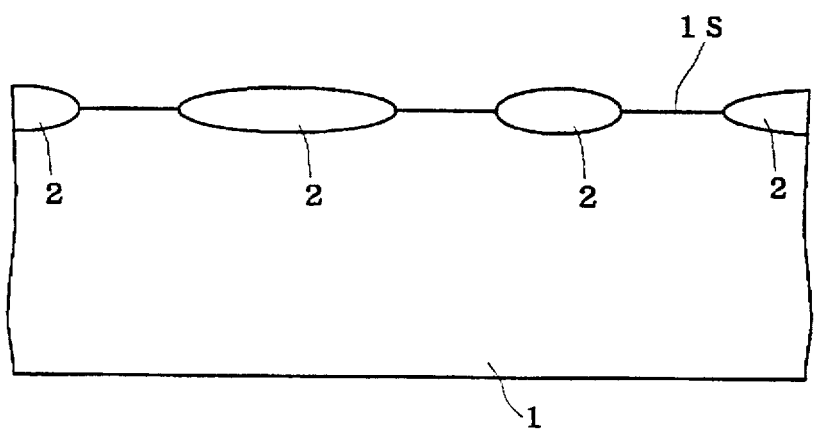
FIG. 6 is a sectional view showing the structure taken along the line b—b of the plan view of FIG. 5.

FIG. 6 is a sectional view taken along the line b—b of the plan view of FIG. 5. As shown in FIGS. 5 and 6, the field oxide films 2 for device isolation having a thickness of about 400 nm are formed on the main surface 1S of the silicon substrate 1 by means of the photolithographic technique and the thermal oxidation technique.

Figure 7:
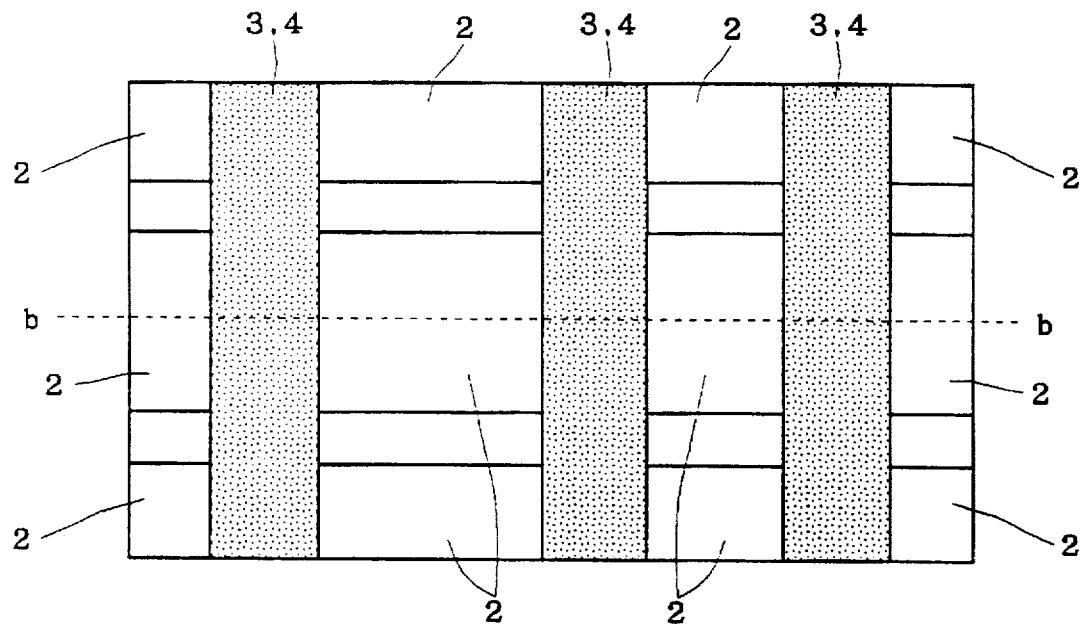
FIG. 7 is a plan view of the structure to illustrate the second step in the process of manufacturing the EEPROM of FIG. 1.
Figure 8:
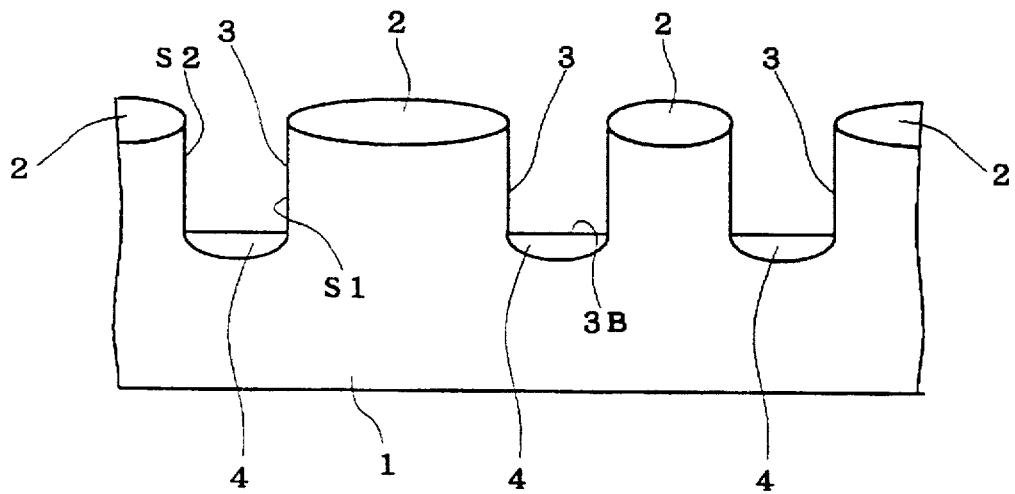
FIG. 8 is a sectional view showing the structure taken along the line b—b of the plan view of FIG. 7.

FIG. 8 is a sectional view taken along the line b—b of the plan view of FIG. 7. As shown in FIGS. 7 and 8, each of the trenches 3 having a depth of about 1 μm and a width of about 0.6 μm is formed in the silicon substrate 1 so as to extend inward from each exposed portion of the main surface 1S,along the second direction D2, by means of the photolithographic technique and the etching technique. The bottom portions of the trenches 3 are implanted with As ion at a dose of about $3 \times 10^{15}/cm^2$. After that, the implanted impurities are diffused by means of the thermal diffusion technique, thereby forming the source impurity diffusion layers 4 along the bottom surfaces 3B of the trenches 3.

Figure 9:
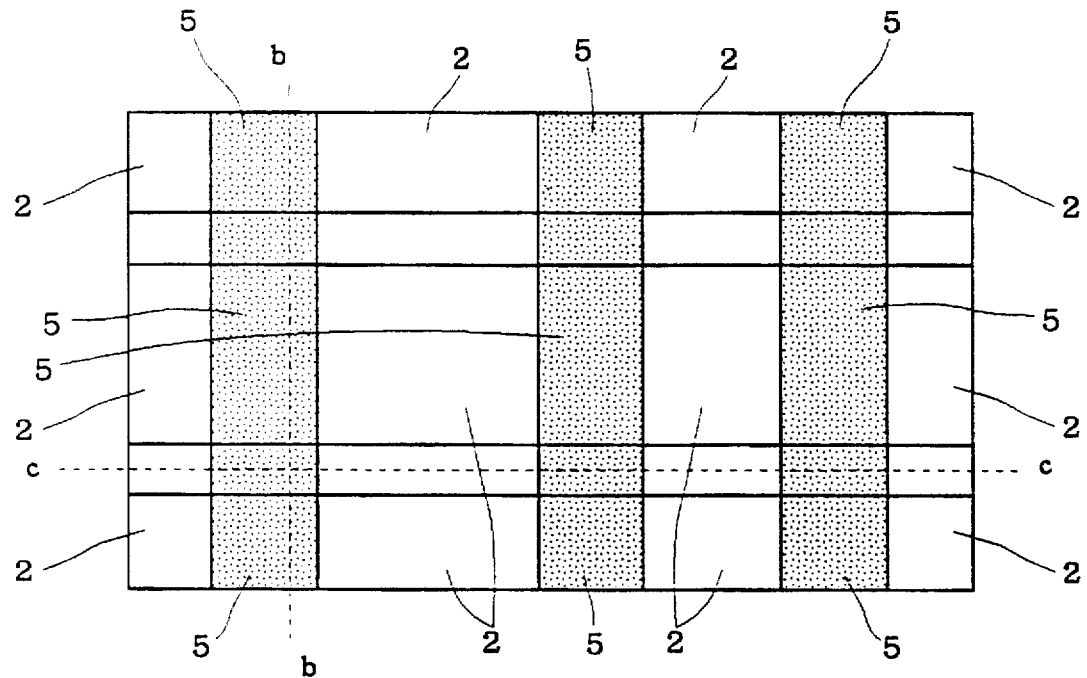
FIG. 9 is a plan view of the structure to illustrate the third step in the process of manufacturing the EEPROM of FIG. 1.
Figure 10:
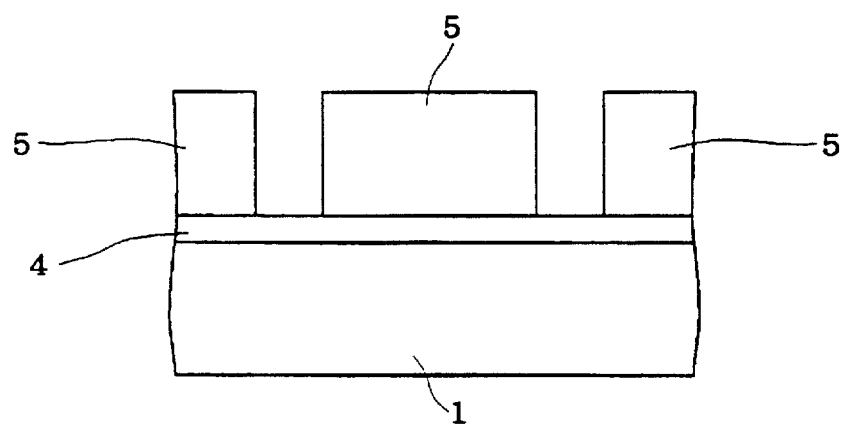
FIG. 10 is a sectional view showing the structure taken along the line b—b of the plan view of FIG. 9.
Figure 11:
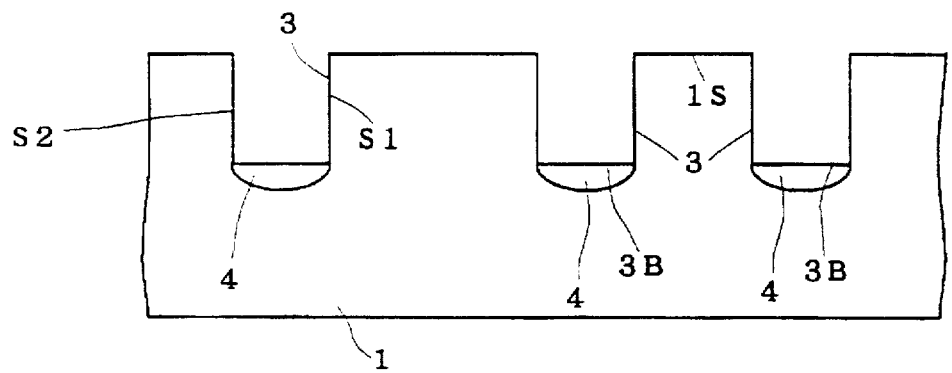
FIG. 11 is a sectional view showing the structure taken along the line c—c of the plan view of FIG. 9.

FIGS. 10 and 11 are sectional views taken along the lines b—b and c—c of the plan view of FIG. 9, respectively. As shown in FIGS. 9 to 11, an insulating film is provided inside the trench 3 and processed by means of the photolithographic technique and the etching technique to form the insulating films 5 for device isolation. The manufacturing steps thereafter will be discussed referring to the sectional views taken along the line c—c of FIG. 9.

Figure 12:
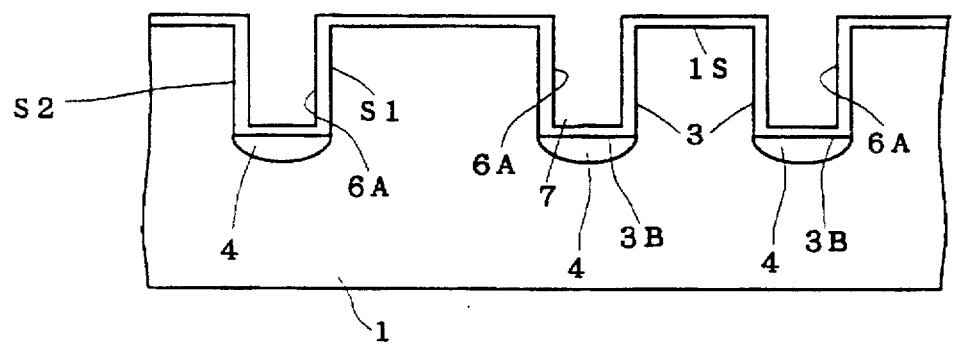
FIG. 12 is a sectional view of the structure to illustrate the fourth step in the process of manufacturing the EEPROM of FIG. 1.

As shown in FIG. 12, a gate oxide film 6A having a thickness of about 10 nm is formed on the main surface 1S of the silicon substrate 1, the side surfaces S1 and S2 and the bottom surfaces 3B of the trenches 3 by means of the thermal oxidation technique.

Figure 13:
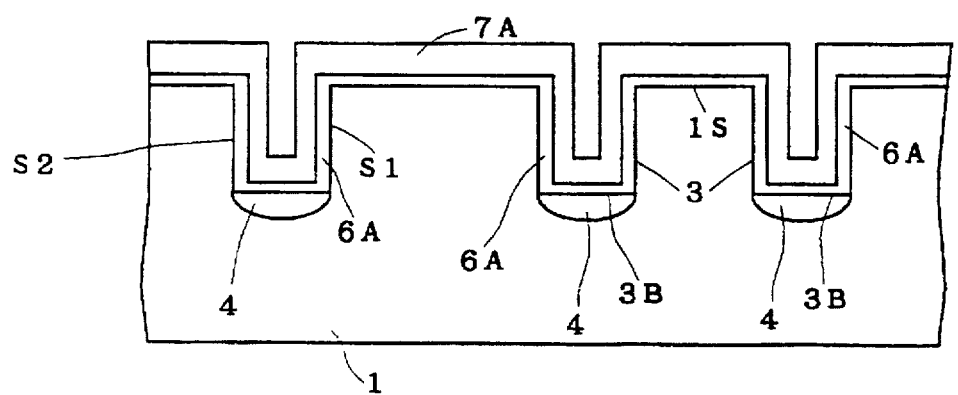
FIG. 13 is a sectional view of the structure to illustrate the fifth step in the process of manufacturing the EEPROM of FIG. 1.

Further, a polycrystalline polysilicon layer 7A having a thickness of about 200 nm to be processed into the floating gate electrode 7 is formed on an upper surface of the gate oxide film 6A, as shown in FIG. 13.

Figure 14:
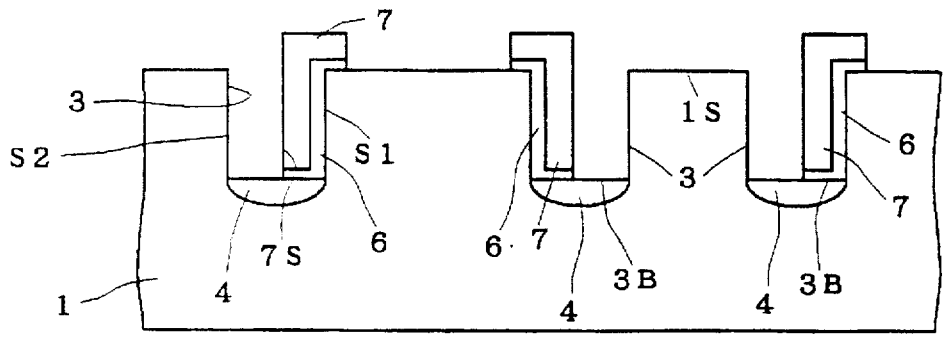
FIG. 14 is a sectional view of the structure to illustrate the sixth step in the process of manufacturing the EEPROM of FIG. 1.

Then, the polycrystalline polysilicon layer 7A and the gate oxide film 6A are processed by means of the photolithographic technique and the etching technique to have desired patterns, thus obtaining the gate oxide films 6 and the floating gate electrodes 7, as shown in FIG. 14.

Figure 15:
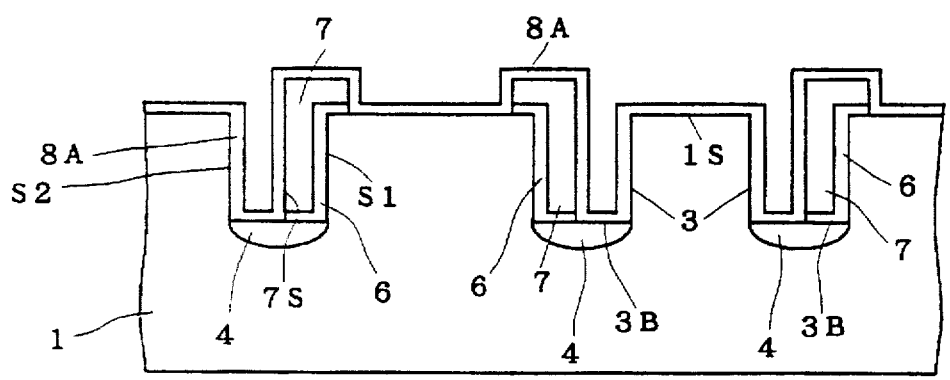
FIG. 15 is a sectional view of the structure to illustrate the seventh step in the process of manufacturing the EEPROM of FIG. 1.
Figure 16:
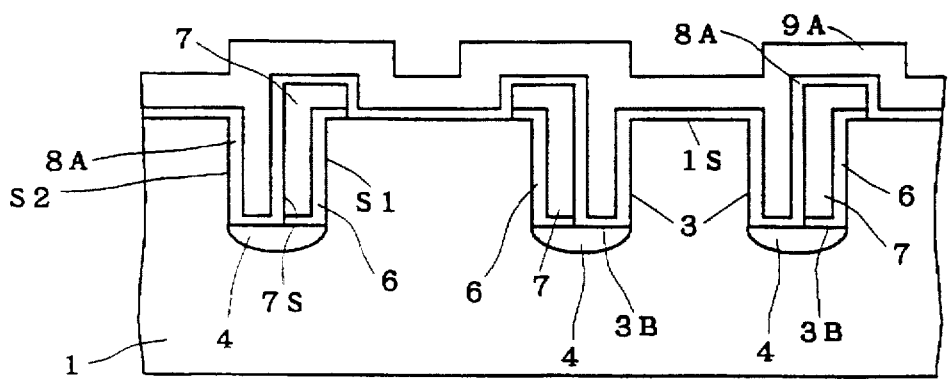
FIG. 16 is a sectional view of the structure to illustrate the eighth step in the process of manufacturing the EEPROM of FIG. 1.
Figure 17:
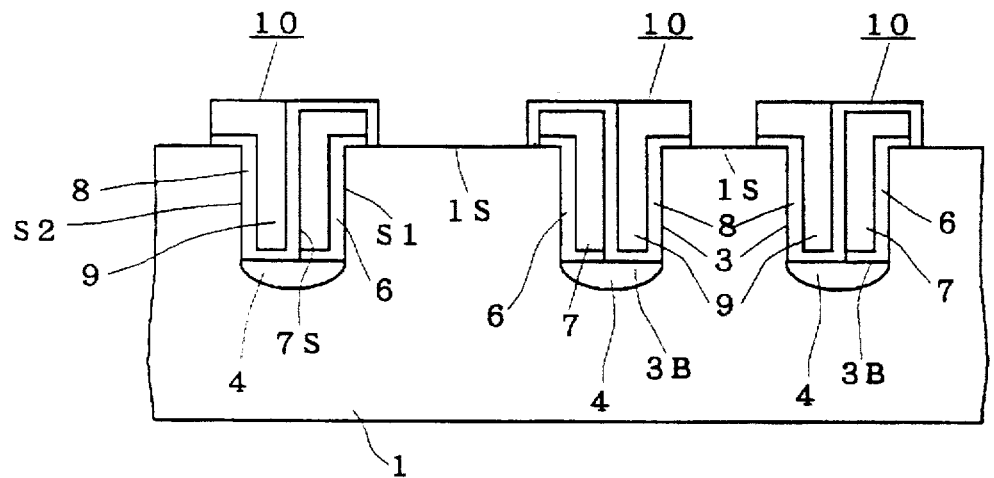
FIG. 17 is a sectional view of the structure to illustrate the ninth step in the process of manufacturing the EEPROM of FIG. 1.

Next, an insulating film 8A having a thickness of about 30 nm to be processed into the gate insulating film 8 is provided on exposed surfaces as shown in FIG. 15 and a polycrystalline polysilicon layer 9A having a thickness of about 300 nm to be processed into the control gate electrode 9 is provided on an upper surface of the insulating film 8A as shown in FIG. 16. Then, as shown in FIG. 17, the polycrystalline polysilicon layer 9A and the insulating film 8A are processed to have the desired patterns by means of the photolithographic technique, a CMP (Chemical Mechanical Polishing) technique and the etching technique, thereby obtaining the gate insulating film 8 and the control gate electrode 9. Through the above steps, the gate electrode portions 10 of memory transistors are obtained.

Figure 18:
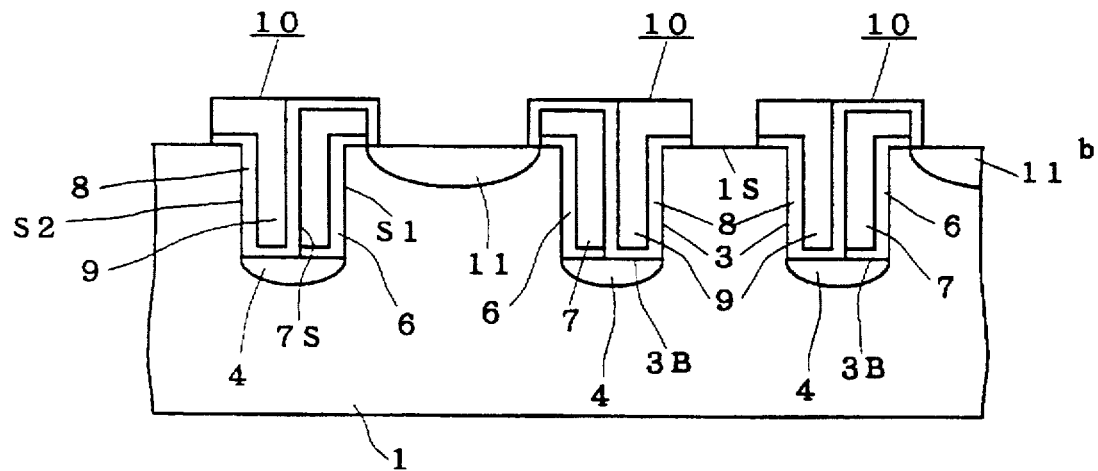
FIG. 18 is a sectional view of the structure to illustrate the tenth step in the process of manufacturing the EEPROM of FIG. 1.

In the subsequent step, each portion of the silicon substrate 1 located between two adjacent gate electrode portions 10 whose FG electrodes 7 are opposed to each other is implanted with As ion at a dose of about $3 \times 10^{15}/cm^2$ from the main surface 1S by means of the photolithographic technique, as shown in FIG. 18. After that, the implanted impurities are diffused by means of the thermal diffusion technique, thus forming the drain impurity diffusion layers 11.

Figure 19:
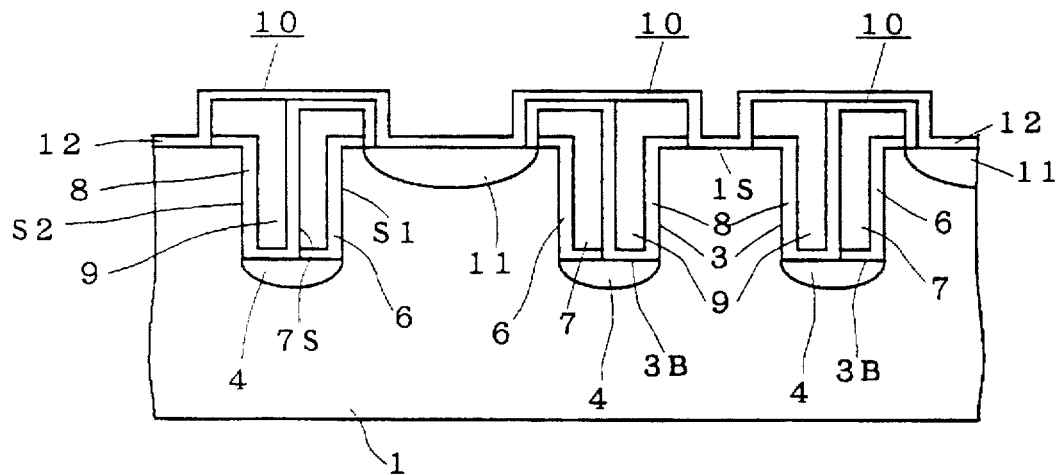
FIG. 19 is a sectional view of the structure to illustrate the eleventh step in the process of manufacturing the EEPROM of FIG. 1.
Figure 20:
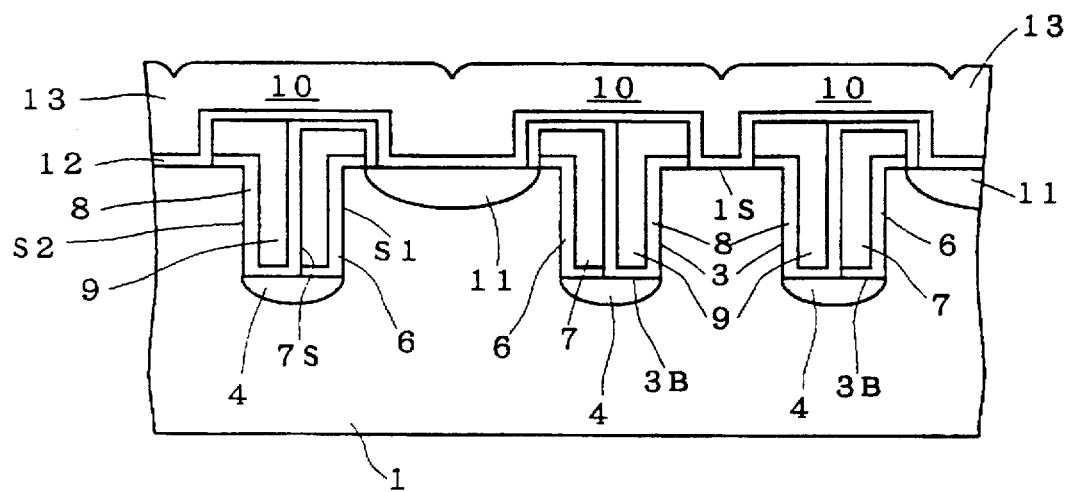
FIG. 20 is a sectional view of the structure to illustrate the twelfth step in the process of manufacturing the EEPROM of FIG. 1.
Figure 21:
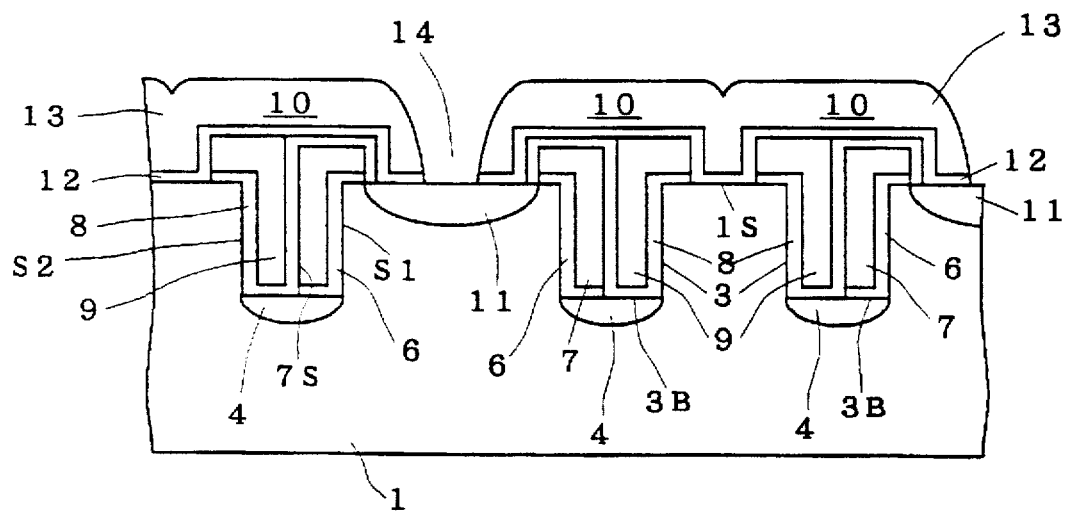
FIG. 21 is a sectional view of the structure to illustrate the thirteenth step in the process of manufacturing the EEPROM of FIG. 1.

As shown in FIG. 19, the interlayer underlying oxide film 12 is formed on an exposed surfaces of the gate electrode portions 10 and portions of the main surface 1S of the silicon substrate 1 having no gate electrode portion 10, and thereafter the whole device region is covered with the interlayer insulating film 13 as shown in FIG. 20. Each open is provided in respective portions of both the interlayer underlying oxide film 12 and the interlayer insulating film 13 which are located on and above the drain impurity diffusion layer 11, thus obtaining each of the contact holes 14 as shown in FIG. 21.

Figure 22:
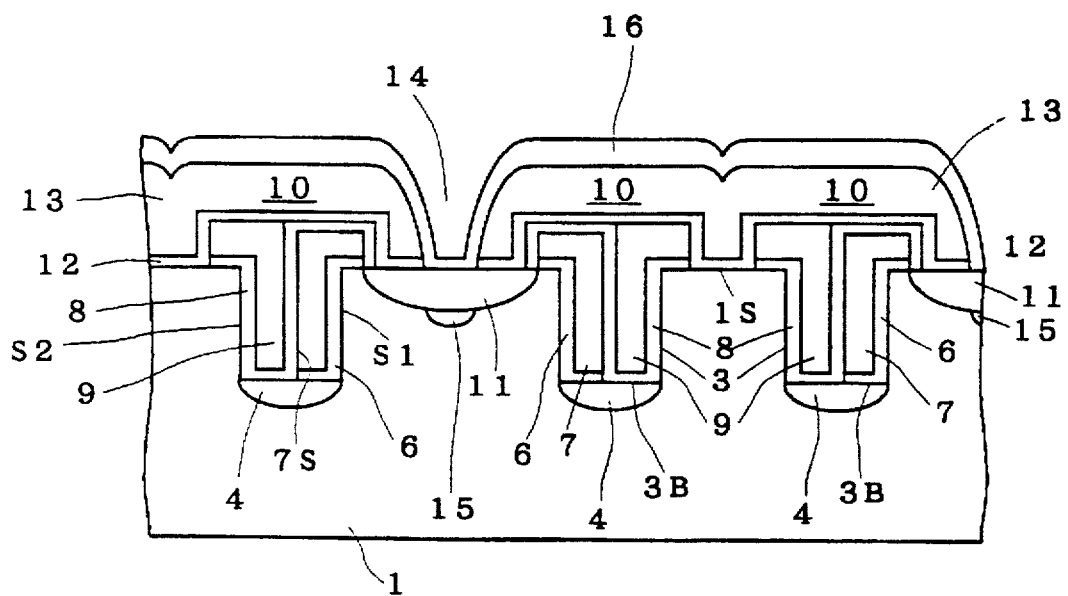
FIG. 22 is a sectional view of the structure to illustrate the fourteenth step in the process of manufacturing the EEPROM of FIG. 1.

Then, as shown in FIG. 22, impurities of the second conductivity type are implanted into the silicon substrate 1 through the contact holes 14 by means of the ion implantation technique, thereby forming the contact impurity diffusion layers 15 for preventing penetration of an aluminum wire into the silicon substrate 1. The aluminum wire layer 16 having a thickness of about 1 μm which is to serve as bit lines is formed on an upper surface of the interlayer insulating film 13 and inside the contact holes 14 to be electrically connected to the drain impurity diffusion layers 11. After that, the passivation film 17 for device protection having a thickness of about 1 μm is formed, as shown in FIGS. 1 to 4, thus completely achieving a chip.

Thus, in the first preferred embodiment, the control gate electrode 9 and the floating gate electrode 7 of each memory cell of the EEPROM are so formed as to be opposed to each other inside the trench 3 which is provided in the silicon substrate 1, and therefore each level difference between both regions having and not having a gate electrode of each memory transistor is reduced and good flatness is achieved. Moreover, each level difference from the bottom surface 3B of each of the trenches 3 is reduced. With the reduced level difference, defocus in photolithography process and a break in an aluminum wire layer are prevented from occurring, thereby obtaining memory transistors of excellent configuration. Furthermore, it is sure to achieve size reduction in cell area in virtue of the device configuration where each of the source impurity diffusion layers 4 is formed along the bottom surface 3B of each of the trenches 3 and each of the drain impurity diffusion layers 11 is shared by two memory cells adjacent thereto.

<The Second Preferred Embodiment>

Figure 23:
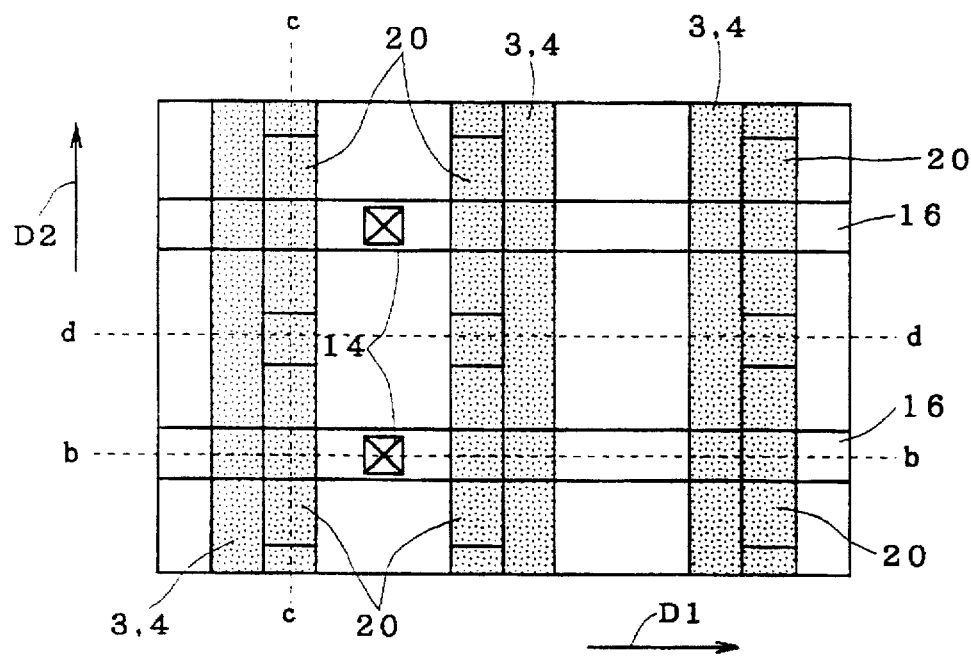
FIG. 23 is a plan view showing a structure of an EEPROM in accordance with a second preferred embodiment of the present invention.
Figure 24:
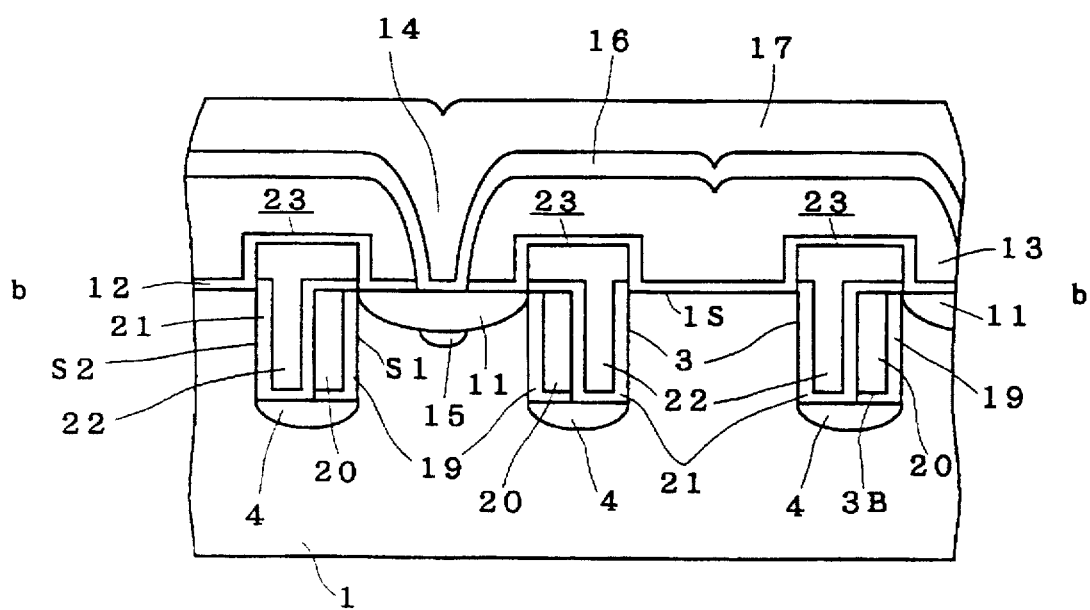
FIG. 24 is a sectional view showing the structure taken along the line b—b of the plan view of FIG. 23.
Figure 25:
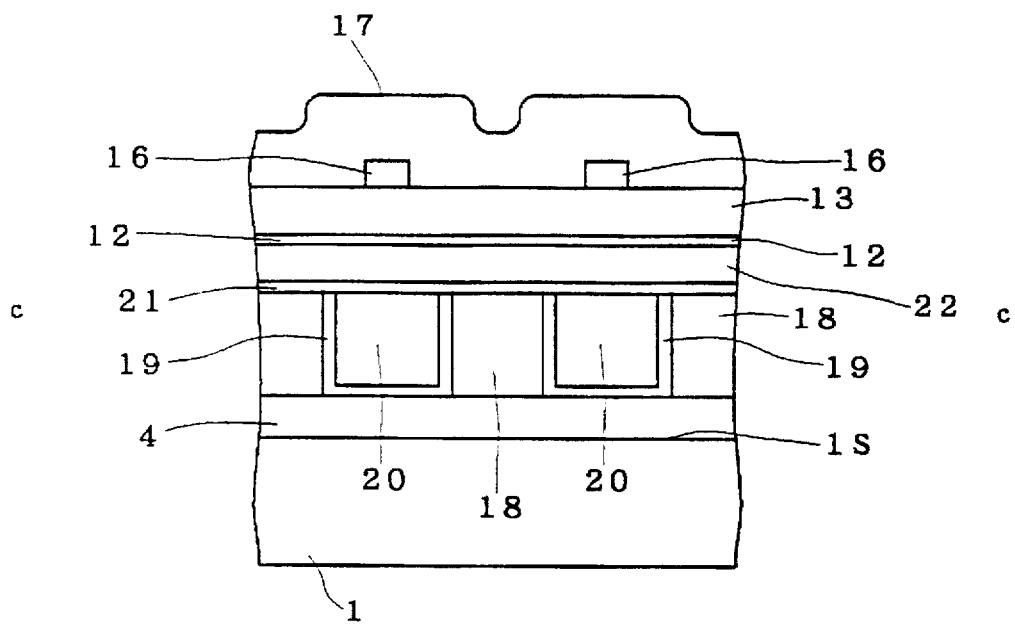
FIG. 25 is a sectional view showing the structure taken along the line c—c of the plan view of FIG. 23.
Figure 26:
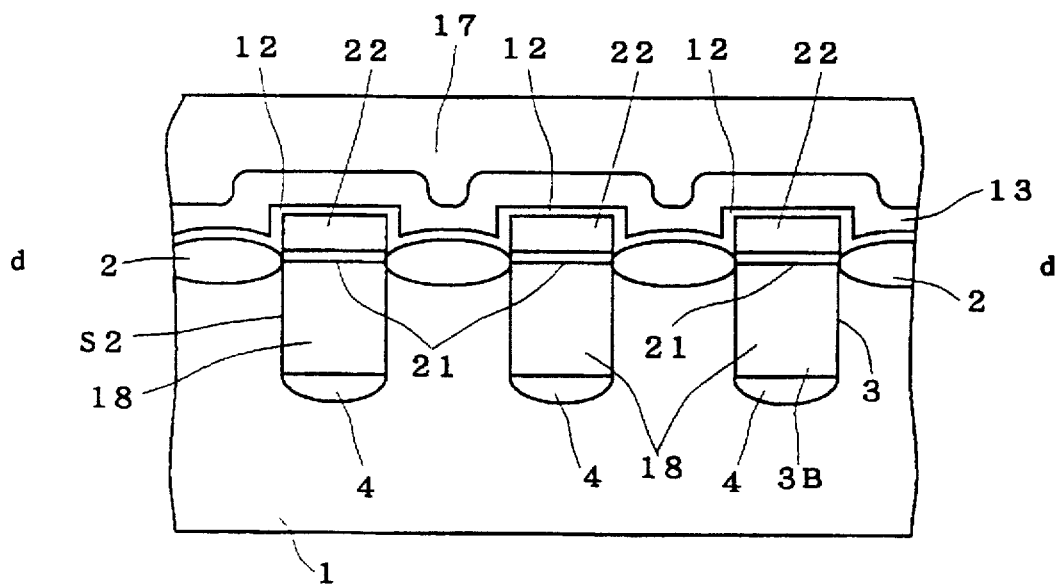
FIG. 26 is a sectional view showing the structure taken along the line d—d of the plan view of FIG. 23.

FIG. 23 is a plan view showing a structure of an EEPROM in accordance with the second preferred embodiment of the present invention. FIGS. 24 to 26 are sectional views taken along the lines b—b, c—c and d—d of FIG. 23, respectively. In these figures, reference numerals 1, 2 and 3 represent the silicon substrate, the field oxide film and the trench, respectively. Each of the source impurity diffusion layers 4 including impurities of a conductivity type opposite to that of the silicon substrate 1 (underlying layer) is formed on the bottom surface 3B of each of the trenches 3. Inside each of the trenches 3 formed are insulating films 18 for device isolation, gate oxide films 19 serving as tunnel oxide films, floating gate electrodes 20, a gate insulating film 21 and a control gate electrode 22. Reference numeral 23 represents a gate electrode portion of a memory transistor consisting of the films 19 and 21 and electrodes 20 and 22. Like elements other than the above are given the same reference numerals as those in FIG. 1.

The second preferred embodiment is different from the first preferred embodiment in configuration of the gate electrode portions. Specifically, the gate electrode portions 23 are different from the gate electrode portions 10 in the following point: each of the FG electrodes 20 is formed only inside each of the trenches 3 and each of the CG electrodes 22 is formed over the trench 3 so as to cover the FG electrode 20 with the gate insulating film 21 interposed therebetween, and furthermore each of the CG electrodes 22 is formed only inside and over the trench 3, not extending over the main surface 1S off the trench 3.

Respective operations in the write/erase/read mode of the second preferred embodiment are the same as those of the first preferred embodiment, and discussion thereof will be omitted.

A process of manufacturing the EEPROM shown in FIGS. 23 to 26 will be discussed.

Like the steps shown in FIGS. 5 to 8 of the first preferred embodiment, the field oxide films 2 for device isolation having a thickness of about 400 nm are formed on the silicon substrate 1 by means of the photolithographic technique and the thermal oxidation technique, and subsequently each of the trenches 3 having a depth of about 1 μm and a width of about 0.6 μm is formed in the silicon substrate 1 so as to extend inward from the corresponding exposed portion of the main surface 1S along the second direction D2, by means of the photolithographic technique and the etching technique. The bottom portion of each of the trenches 3 is implanted with As ion at a dose of about $3 \times 10^{15}/cm^2$. After that, the implanted impurities are diffused by means of the thermal diffusion technique, thereby forming the source impurity diffusion layers 4 along the bottom surfaces 3B of the trenches 3.

Figure 27:
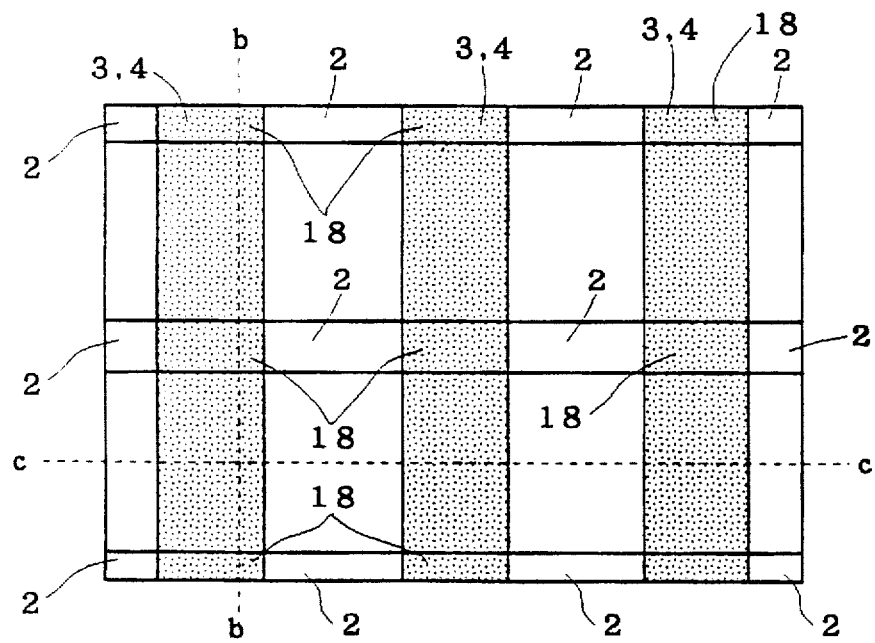
FIG. 27 is a plan view of the structure to illustrate the first step in a process of manufacturing the EEPROM of FIG. 23 in accordance with the second preferred embodiment.
Figure 28:
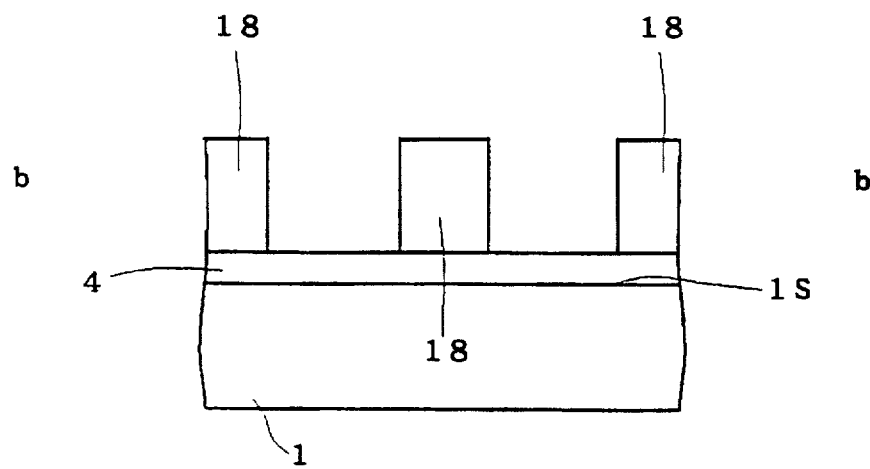
FIG. 28 is a sectional view showing the structure taken along the line b—b of the plan view of FIG. 27.
Figure 29:
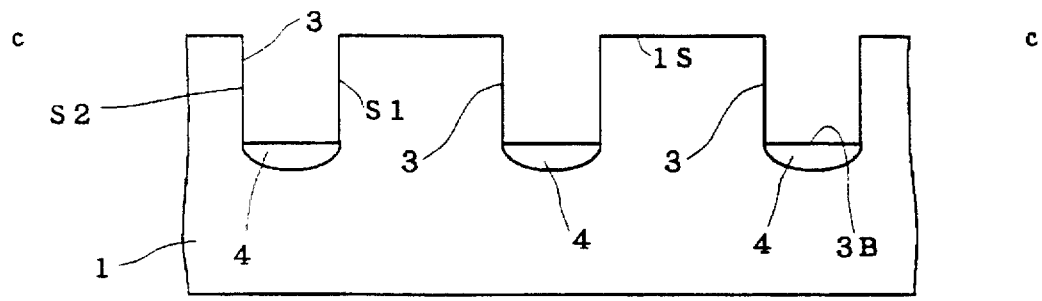
FIG. 29 is a sectional view showing the structure taken along the line c—c of the plan view of FIG. 27.

FIGS. 28 and 29 are sectional views taken along the lines b—b and c—c of the plan view of FIG. 27, respectively. As shown in FIGS. 27 to 29, an insulating film is provided and processed by means of the photolithographic technique and the etching technique to form the insulating films 18 for device isolation. The manufacturing steps thereafter will be discussed referring to the sectional views taken along the line c—c of FIG. 27.

Figure 30:
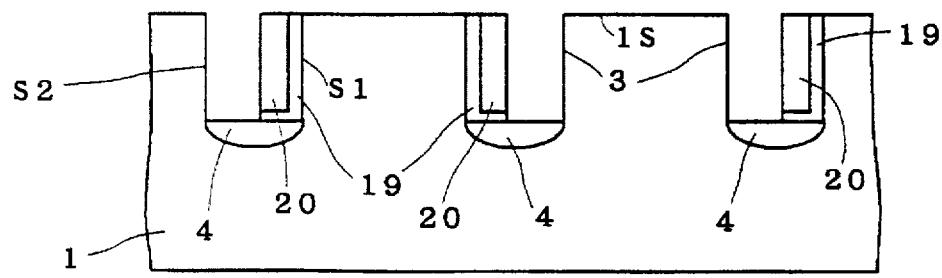
FIG. 30 is a sectional view of the structure to illustrate the second step in the process of manufacturing the EEPROM of FIG. 23 in accordance with the second preferred embodiment.
Figure 31:
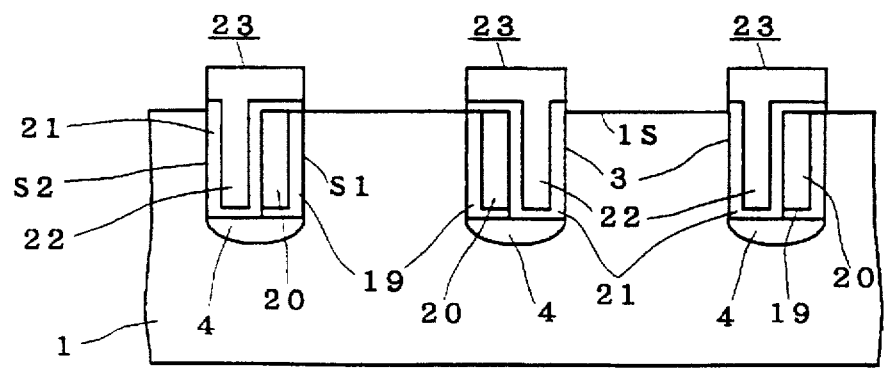
FIG. 31 is a sectional view of the structure to illustrate the third step in the process of manufacturing the EEPROM of FIG. 23 in accordance with the second preferred embodiment.

Like the steps shown in FIGS. 12 and 13 of the first preferred embodiment, the gate oxide film 19 having a thickness of about 10 nm is formed on the silicon substrate 1 and further a polycrystalline polysilicon layer having a thickness of about 200 nm to be processed into the floating gate electrode 20 is formed on the gate oxide film 19. After that, as shown in FIG. 30, the polycrystalline polysilicon layer and the like are processed by means of the photolithographic technique and the etching technique to have desired patterns, thus obtaining the gate oxide films 19 and the floating gate electrodes 20.

Like the steps shown in FIGS. 15 and 16 of the first preferred embodiment, an insulating film having a thickness of about 30 nm to be processed into the insulating film 21 is formed and further a polycrystalline polysilicon layer having a thickness of about 300 nm to be processed into the control gate electrode 22 is formed thereon. The insulating film and the polycrystalline polysilicon layer are processed to have the desired patterns by means of the photolithographic technique and the etching technique, thereby obtaining the gate insulating films 21 and the control gate electrodes 22. Through the above steps, each of the gate electrode portions 23 of each memory transistor, consisting of the films 19 and 21 and the electrodes 20 and 22, is obtained.

The steps discussed below are the same as those of FIGS. 18 to 22 of the first preferred embodiment. Specifically, a portion of the silicon substrate 1 alongside the floating gate electrode 20 is implanted with As ion at a dose of about $3 \times 10^{15}/cm^2$ by means of the photolithographic technique. After that, the implanted impurities are diffused by means of the thermal diffusion technique, thus forming the drain impurity diffusion layers 11. The interlayer underlying oxide film 12 is formed on the gate electrode portions 23 and portions of the main surface 1S of the silicon substrate 1 having no gate electrode portion 23, and thereafter the whole device region is covered with the interlayer insulating film 13. Each open is provided in respective portions of both the interlayer underlying oxide film 12 and the interlayer insulating film 13 which are located on and above the drain impurity diffusion layer 11, thus obtaining the contact hole 14. Then, impurities of a conductivity type opposite to that of the silicon substrate 1 are implanted into the silicon substrate 1 through the contact holes 14 by means of the ion implantation technique, thereby forming the contact impurity diffusion layers 15 for preventing penetration of an aluminum into the silicon substrate 1. The aluminum wire layer 16 having a thickness of about 1 μm which is to serve as bit lines is formed on the interlayer insulating film 13 and inside the contact holes 14 to be electrically connected to the drain impurity diffusion layers 11. After that, the passivation film 17 for device protection having a thickness of about 1 μm is formed, as shown in FIGS. 23 to 26, thus completely achieving a chip.

Thus, in the second preferred embodiment, the control gate electrode 22 and floating gate electrode 20 of each memory cell of the EEPROM are so formed as not to extend over the main surface 1S off the corresponding trench 3, being accommodated within the trench 3, and therefore each level difference between both regions having and not having a gate electrode of a memory transistor is reduced and good flatness is achieved. With the reduced level difference, defocus in photolithography process and a break in an aluminum wire are prevented from occurring, thereby obtaining memory transistors of excellent configuration. On this point, the second preferred embodiment achieves the same effect as the first preferred embodiment. The second preferred embodiment is more advantageous in that further size reduction in cell area can be achieved without deterioration of integration since each of the source regions is located on the bottom surface 3B of each of the trenches 3 and each of the gate electrode portions 23 of each memory cell does not extend off the corresponding trench 3.

<The Third Preferred Embodiment>

Figure 32:
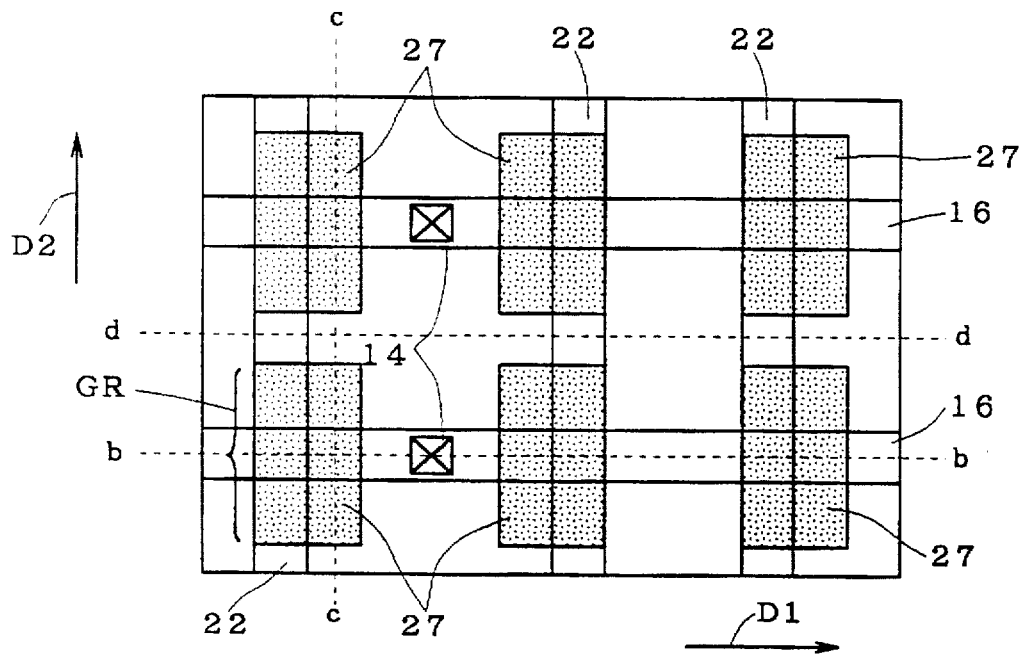
FIG. 32 is a plan view showing a structure of an EEPROM of a third preferred embodiment of the present invention.
Figure 33:
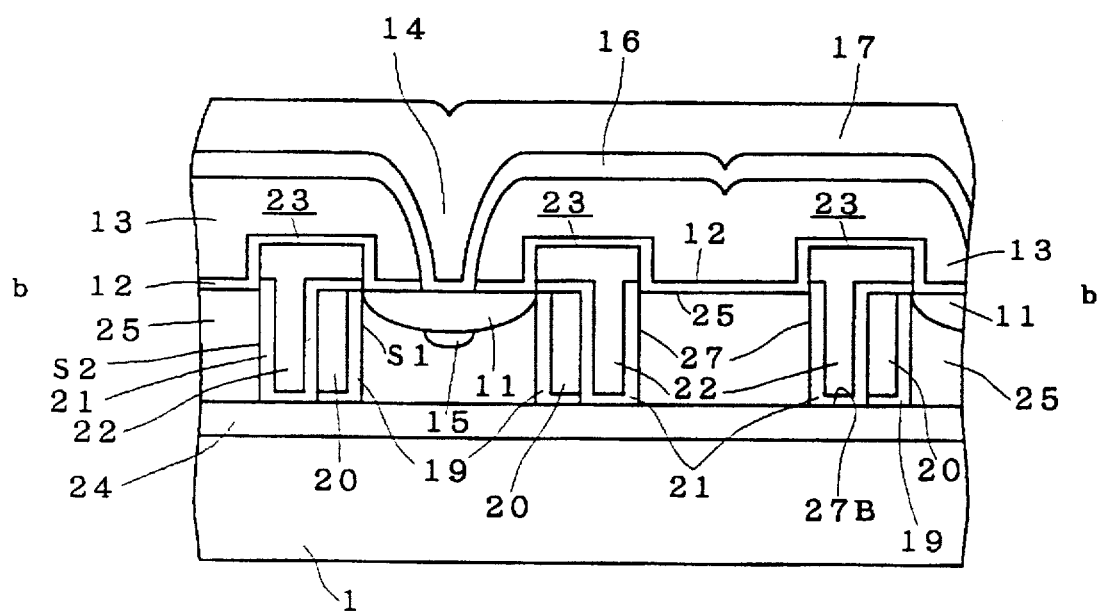
FIG. 33 is a sectional view showing the structure taken along the line b—b of the plan view of FIG. 32.
Figure 34:
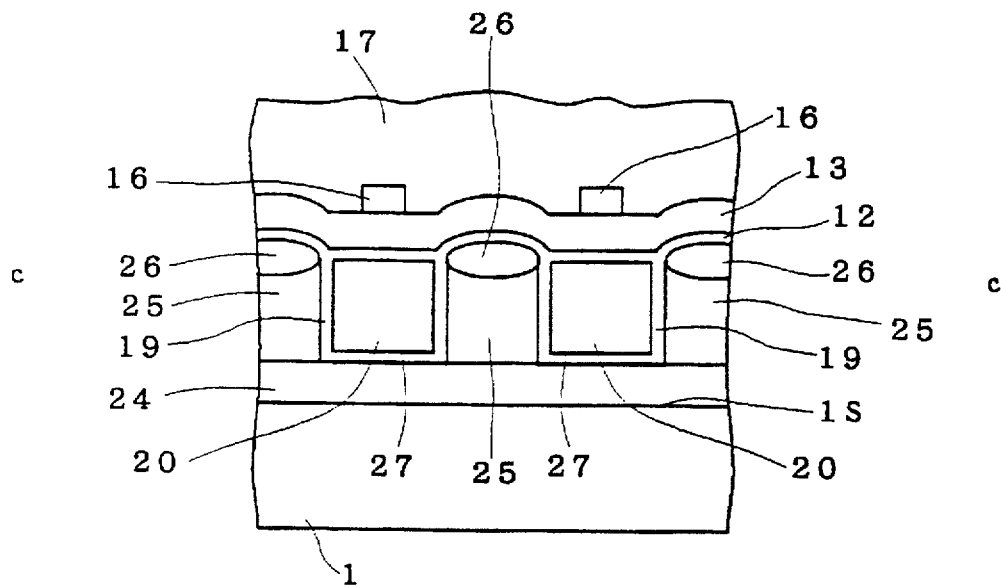
FIG. 34 is a sectional view showing the structure taken along the line c—c of the plan view of FIG. 32.
Figure 35:
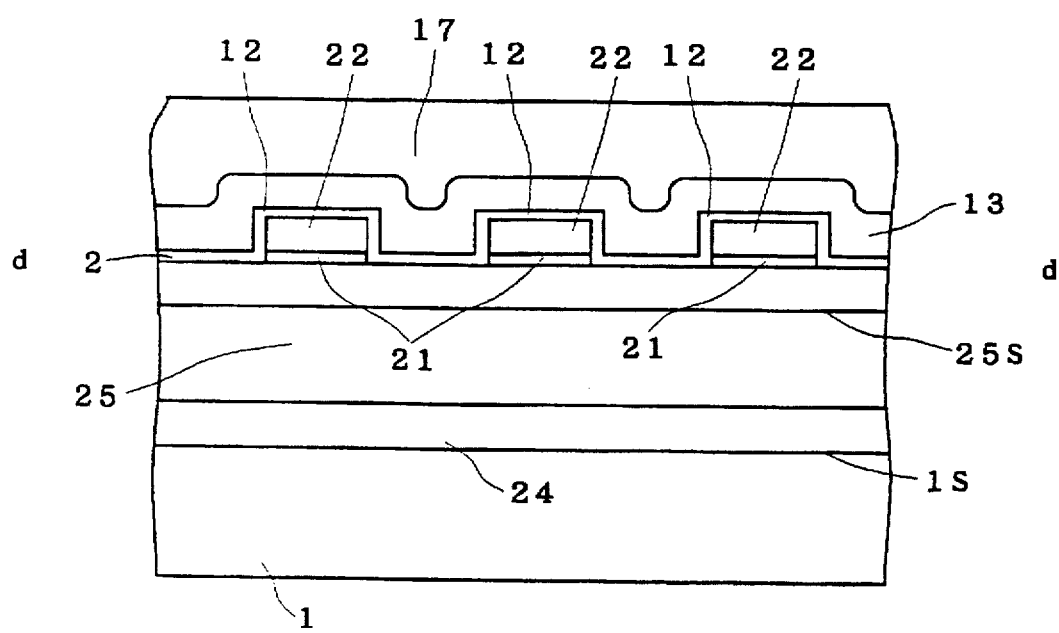
FIG. 35 is a sectional view showing the structure taken along the line d—d of the plan view of FIG. 32.

FIG. 32 is a plan view showing a structure of an EEPROM in accordance with the third preferred embodiment of the present invention. FIGS. 33 to 35 are sectional views taken along the lines b—b, c—c and d—d of FIG. 32, respectively. In these figures, a source impurity diffusion layer 24 including impurities of a conductivity type opposite to that of the silicon substrate 1 is formed entirely on the main surface 1S of the silicon substrate 1. A monocrystalline silicon layer 25 (semiconductor layer) is formed on an upper surface of the source impurity diffusion layer 24. Each of trenches 27 is formed in the monocrystalline silicon layer 25, extending inward from an upper surface 25S of the monocrystalline silicon layer 25, and each of the gate electrode portions 23 as discussed in the second preferred embodiment is provided inside each of the trenches 27. Specifically, inside each of the trenches 27 formed are the gate oxide film 19, the floating gate electrode 20, the gate insulating film 21 and the control gate electrode 22. Thus, the characteristic feature of the third preferred embodiment lies in that the source region is formed entirely on the main surface 1S of the silicon substrate 1, and other structural features are basically the same as those of the second preferred embodiment. Naturally, the gate electrode portions 10 of the first preferred embodiment may be used instead of the gate electrode portions 23.

Reference numeral 26 represents a field oxide film. Like elements are given the same reference numerals as those of the first and second preferred embodiments.

Respective operations in the write/erase/read mode in the third preferred embodiment are basically the same as those of the first preferred embodiment, and discussion thereof will be omitted.

Figure 36:
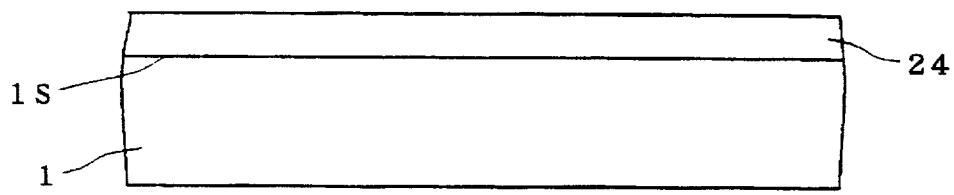
FIG. 36 is a sectional view of the structure to illustrate the first step in a process of manufacturing the EEPROM of FIG. 32 in accordance with the third preferred embodiment.
Figure 37:
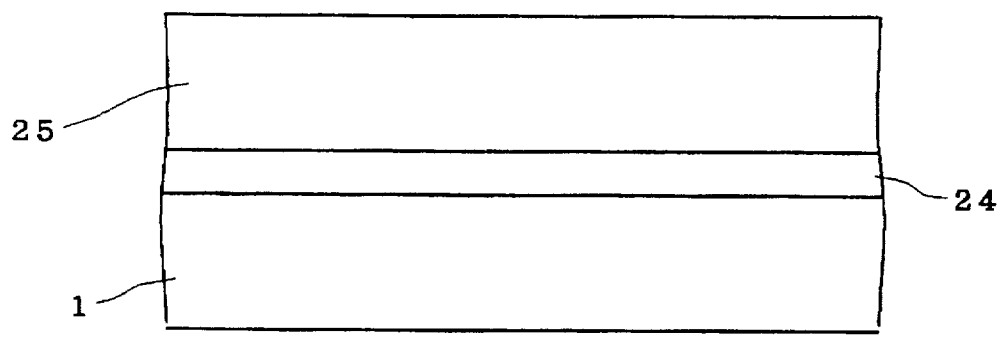
FIG. 37 is a sectional view of the structure to illustrate the second step in the process of manufacturing the EEPROM of FIG. 32 in accordance with the third preferred embodiment.

FIGS. 36 to 42 are sectional and plan views of the structure to illustrate a process of manufacturing the EEPROM shown in FIGS. 32 to 35. FIGS. 36 and 37 are the sectional views showing the same portion as that of FIG. 33.

As shown in FIG. 36, the main surface 1S of the silicon substrate 1 is entirely implanted with As ion at a dose of about $3 \times 10^{15}/cm^2$. After that, the implanted impurities are diffused by means of the thermal diffusion technique, thereby forming the source impurity diffusion layer 24.

Subsequently, as shown in FIG. 37, the monocrystalline silicon layer 25 having a thickness of about 1 μm is epitaxially grown on the upper surface of the source impurity diffusion layer 24.

Figure 38:
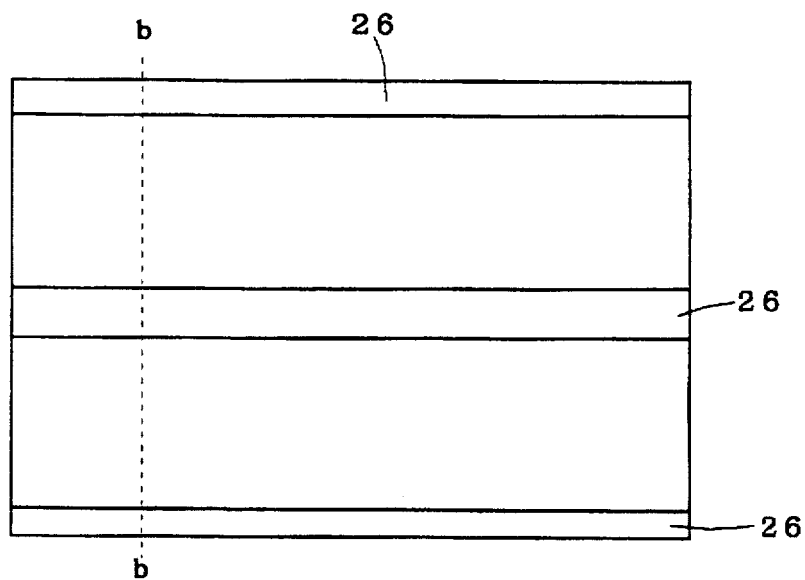
FIG. 38 is a sectional view of the structure to illustrate the third step in the process of manufacturing the EEPROM of FIG. 32 in accordance with the third preferred embodiment.
Figure 39:
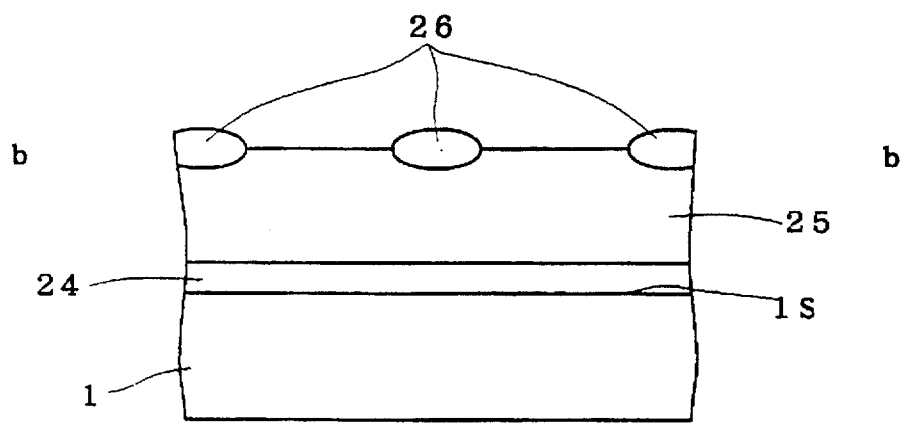
FIG. 39 is a sectional view showing the structure taken along the line b—b of the plan view of FIG. 38.

FIG. 39 is a sectional view taken along the line b—b of the plan view of FIG. 38. As shown in FIGS. 38 and 39, the field oxide films 26 for device isolation having a thickness of about 400 nm are formed in the upper surface 25S of the monocrystalline silicon layer 25 by means of the photolithographic technique and the thermal oxidation technique.

Figure 40:
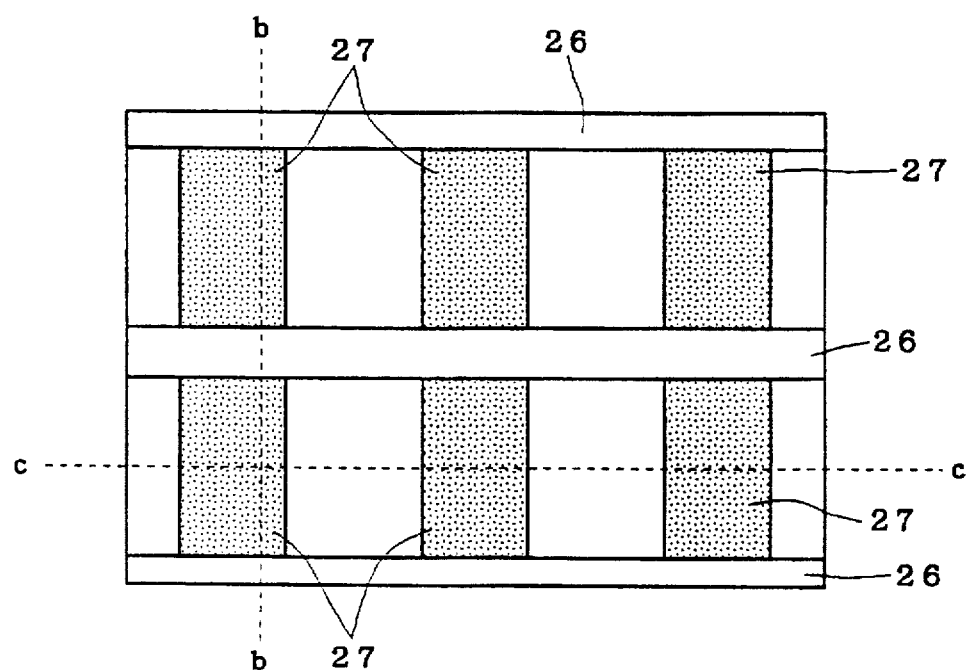
FIG. 40 is a plan view showing a structure of another EEPROM in accordance with the third preferred embodiment of the present invention.
Figure 41:
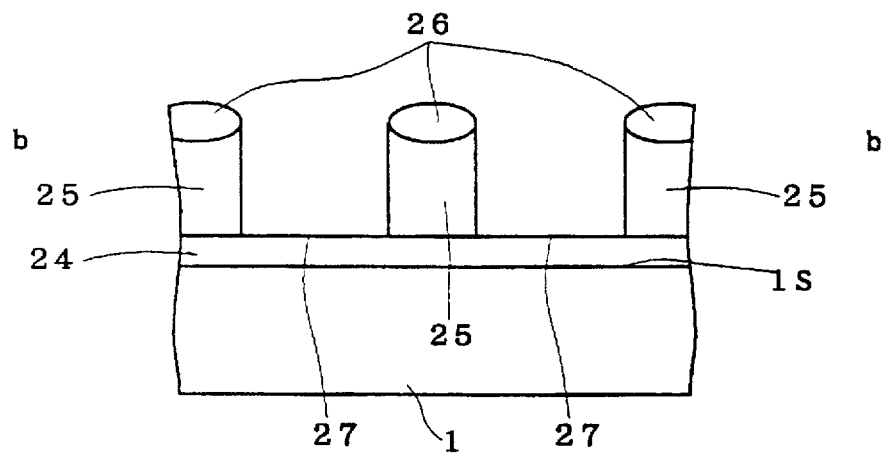
FIG. 41 is a sectional view showing the structure taken along the line b—b of the plan view of FIG. 40.
Figure 42:
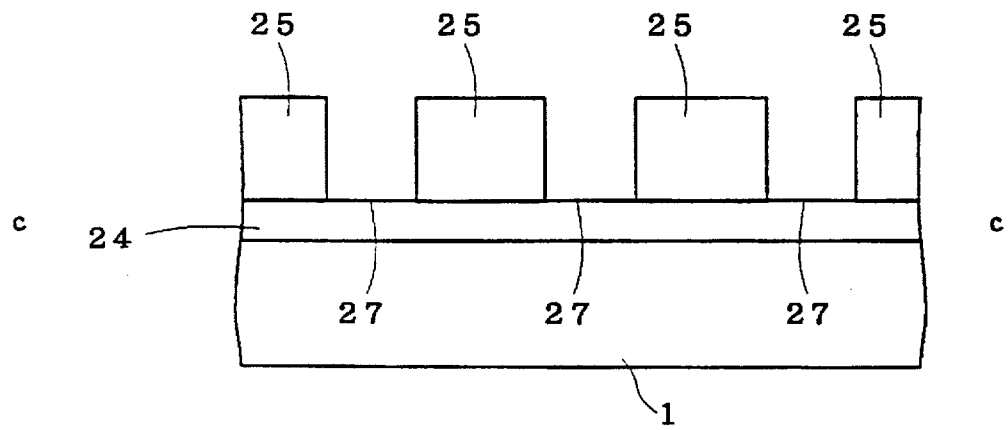
FIG. 42 is a sectional view showing the structure taken along the line c—c of the plan view of FIG. 40.
Figure 43:
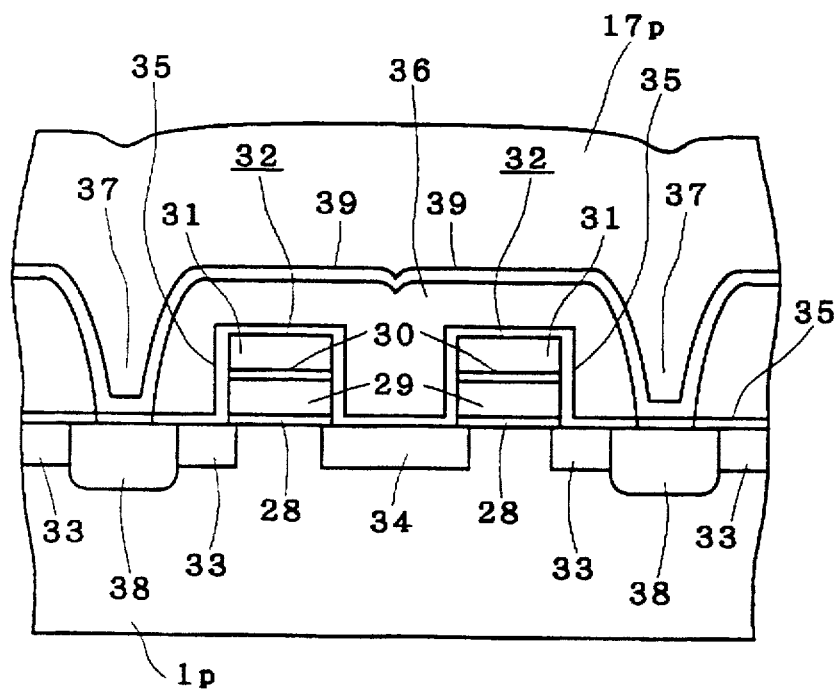
FIG. 43 is a sectional view showing a structure of a known EEPROM.
Figure 44:
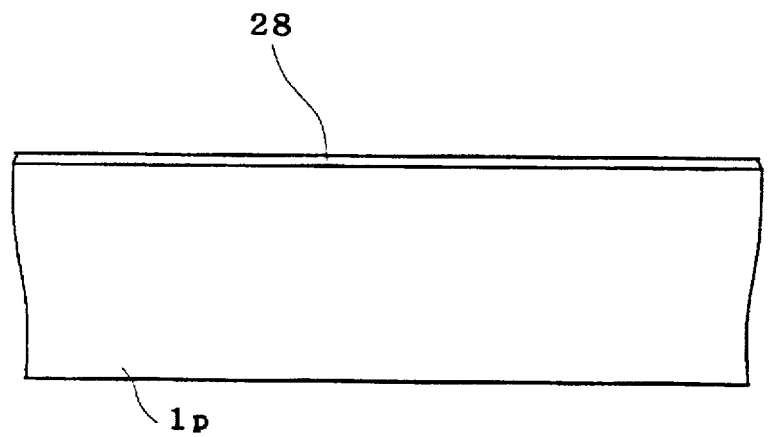
FIG. 44 is a sectional view of the structure to illustrate the first step in a process of manufacturing the known EEPROM of FIG. 43.
Figure 45:
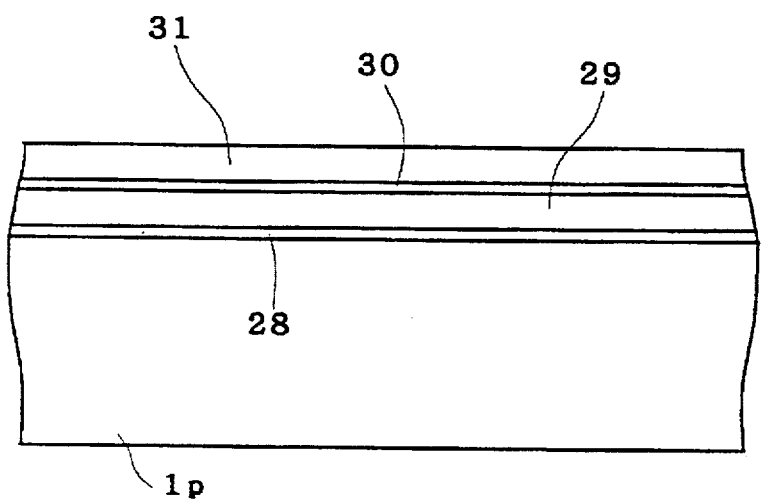
FIG. 45 is a sectional view of the structure to illustrate the second step in the process of manufacturing the known EEPROM of FIG. 43.
Figure 46:
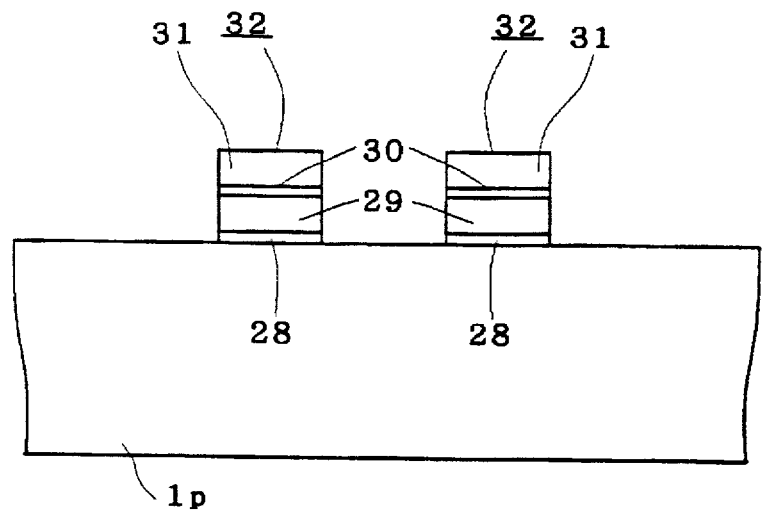
FIG. 46 is a sectional view of the structure to illustrate the third step in the process of manufacturing the known EEPROM of FIG. 43.
Figure 47:
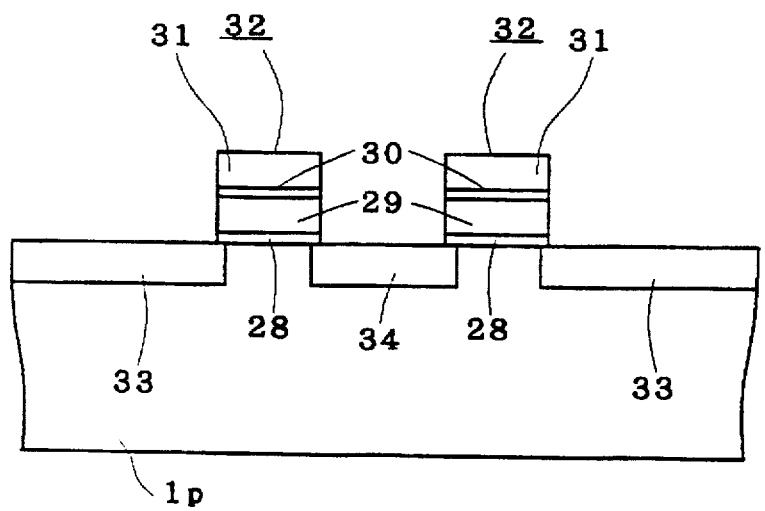
FIG. 47 is a sectional view of the structure to illustrate the fourth step in the process of manufacturing the known EEPROM of FIG. 43.
Figure 48:
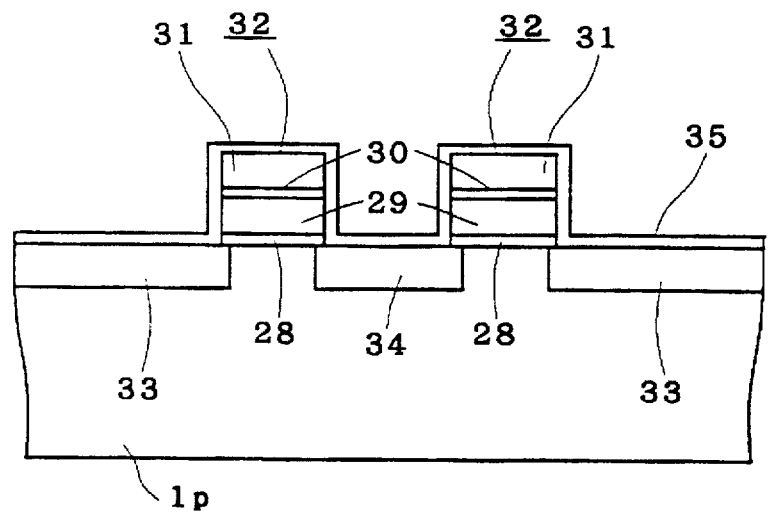
FIG. 48 is a sectional view of the structure to illustrate the fifth step in the process of manufacturing the known EEPROM of FIG. 43.
Figure 49:
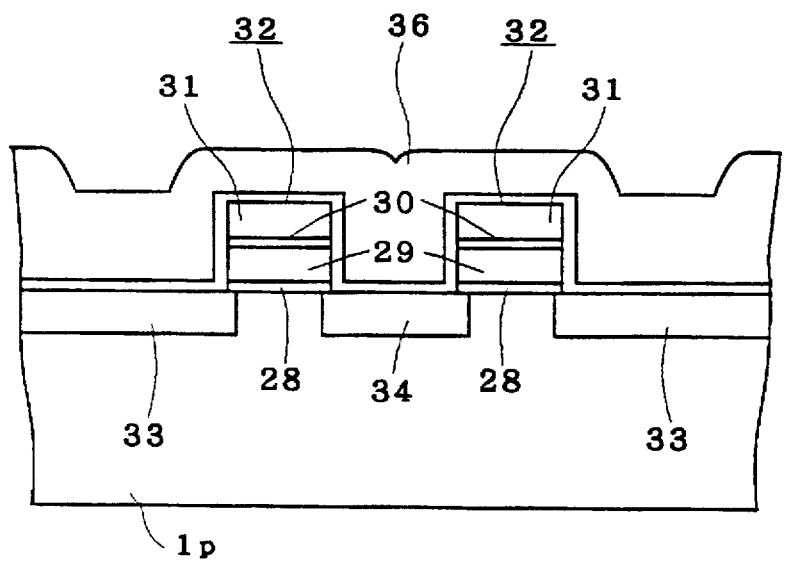
FIG. 49 is a sectional view of the structure to illustrate the sixth step in the process of manufacturing the known EEPROM of FIG. 43.
Figure 50:
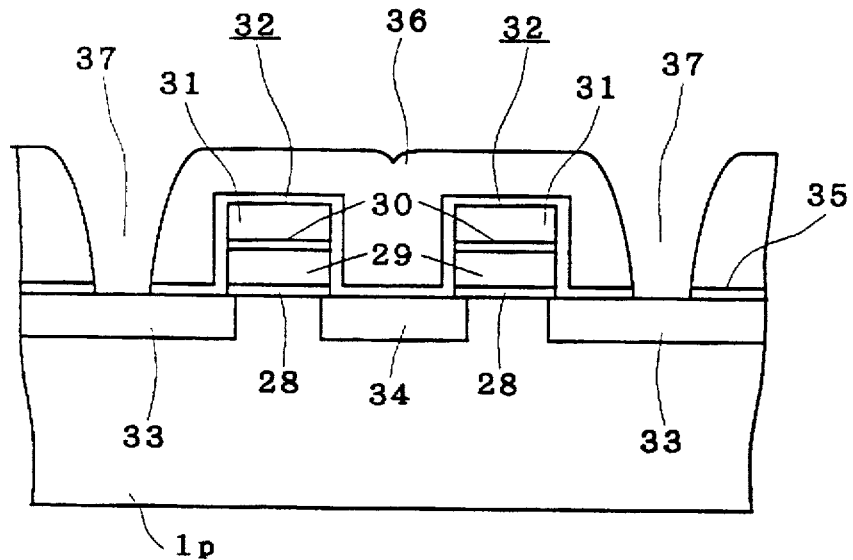
FIG. 50 is a sectional view of the structure to illustrate the seventh step in the process of manufacturing the known EEPROM of FIG. 43.
Figure 51:
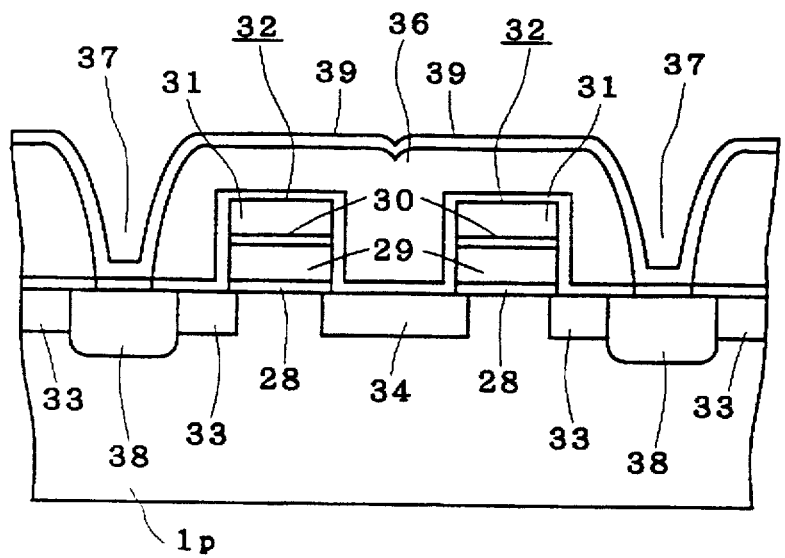
FIG. 51 is a sectional view of the structure to illustrate the eighth step in the process of manufacturing the known EEPROM of FIG. 43.

FIGS. 41 and 42 are sectional views taken along the lines b—b and c—c of the plan view of FIG. 40, respectively. As shown in FIGS. 40 to 42, the trenches 27 having a depth of about 1 μm are formed in the monocrystalline silicon layer 25 by means of the photolithographic technique and the etching technique.

The steps discussed below are the same as those of the second preferred embodiment. The gate oxide film having a thickness of about 10 nm is formed inside the trenches 27 and the upper surface 25S of the monocrystalline silicon layer 25 and further a polycrystalline polysilicon layer having a thickness of about 200 nm to be processed into the floating gate electrode 20 is formed on the gate oxide film 19. After that, the gate oxide film and the polycrystalline polysilicon layer are processed to have desired patterns by means of the photolithographic technique and the etching technique, thus obtaining the gate oxide films 19 and the floating gate electrodes 20. An insulating film having a thickness of about 30 nm to be processed into the insulating film 21 is formed and further a polycrystalline polysilicon layer having a thickness of about 300 nm to be processed into the control gate electrode 22 is formed thereon. The insulating film and the polycrystalline polysilicon layer are processed to have the desired patterns by means of the photolithographic technique and the etching technique, thereby obtaining the gate insulating films 21 and the control gate electrodes 22. Through the above steps, each of the gate electrode portions 23 of each memory transistor, consisting of the films 19 and 21 and the electrodes 20 and 22, is obtained. In a subsequent step, a portion of the silicon substrate 1 alongside the floating gate electrode 20 is implanted with As ion at a dose of about $3 \times 10^{15}/cm^2$ by means of the photolithographic technique. After that, the implanted impurities are diffused by means of the thermal diffusion technique, thus forming the drain impurity diffusion layer 11. The interlayer underlying oxide film 12 is formed on the gate electrode portions 23 and portions of the upper surface 25S of the monocrystalline silicon layer 25 having no gate electrode portion 23, and thereafter the whole device region is covered with the interlayer insulating film 13. Each open is provided in respective portions of both the interlayer underlying oxide film 12 and the interlayer insulating film 13 which are located on and above the drain impurity diffusion layer 11, thus obtaining the contact hole 14. Then, impurities of a conductivity type opposite to that of the monocrystalline silicon layer 25 or the silicon substrate 1 are implanted into the monocrystalline silicon layer 25 through the contact holes 14 by means of the ion implantation technique, thereby forming the contact impurity diffusion layers 15 for preventing penetration of an aluminum into the monocrystalline silicon layer 25. The aluminum wire layer 16 having a thickness of about 1 μm which is to serve as bit lines is formed on the interlayer insulating film 13 and inside the contact holes 14 to be electrically connected to the drain impurity diffusion layer 11. After that, the passivation film 17 for device protection having a thickness of about 1 μm is formed, as shown in FIGS. 32 to 35, thus completely achieving a chip.

The silicon substrate 1 (the first underlying layer) and the monocrystalline silicon layer 25 (the second underlying layer) are termed together "an underlying layer of the first conductivity type".

Thus, in the third preferred embodiment, the control gate electrode 22 and floating gate electrode 20 of each memory cell of the EEPROM are so formed as not to extend over the upper surface 25S of the monocrystalline silicon layer 25 off each of the trenches 27, being accommodated within each of the trenches 27, and therefore each level difference between both regions having and not having a gate electrode of a memory transistor is reduced and good flatness is achieved. With the reduced level difference, defocus in photolithography process and a break in an aluminum wire layer are prevented from occurring, thereby obtaining memory transistors of excellent configuration. Similar to the second preferred embodiment, the third preferred embodiment is more advantageous in that further size reduction in cell area can be achieved without degradation of integration since each of the source regions 24 is located on the bottom surface 27B of each of the trenches 27 and each of the gate electrode portions 23 of each memory cell does not extend off the corresponding trench 27.

Moreover, the configuration of the third preferred embodiment where the source impurity diffusion layer 24 is formed entirely over the main surface 1S of the silicon substrate 1 and then each of the trenches 27 is provided only in each memory gate region GR (see FIG. 32) can eliminate the need for formation of the insulating films for device isolation inside each of the trenches, which would be required in the first and second preferred embodiments, thereby advantageously cutting the step therefor. Accordingly, the semiconductor storage device in accordance with the third preferred embodiment has a simple configuration which affords fabrication advantages over the first and second preferred embodiments, surely without degradation of coupling ratio.

<Conclusion>

As discussed above, the device in accordance with the present invention has the configuration where the control gate electrode and the floating gate electrode of a memory, such as EEPROM, are so formed as to be opposed to each other inside the trench provided in the semiconductor substrate, and therefore achieves better flatness in a vertical structure.

While the invention has been shown and described in detail, the foregoing description is in all aspects illustrative and not restrictive. It is therefore understood that numerous modifications and variations can be devised without departing from the scope of the invention.

We claim:

1. A semiconductor memory device, comprising:

an underlying layer of a first conductivity type;

a trench formed in said underlying layer, extending inward from a main surface of said underlying layer to a prescribed depth, having a prescribed width in a first direction of said main surface and extending along a second direction perpendicular to said first direction;

a first impurity diffusion layer region of a second conductivity type formed at least under a bottom surface of said trench in said underlying layer;

a first gate insulating film formed at least on a side surface of said trench along said second direction and a part of said bottom surface of said trench in a portion inside said trench located in a region for a gate electrode portion to be formed;

a floating gate electrode formed so as to cover at least an upper surface of said first gate insulating film in said portion inside said trench located in said region for said gate electrode portion to be formed;

a second gate insulating film formed at least on one side surface of said floating gate electrode along said second direction, without coming into contact with said upper surface of said first gate insulating film, and formed on the other part of said bottom surface of said trench, the other side surface of said trench opposed to said one side surfaces, and on an upper surface of said floating gate electrode extending along the main surface which is opposed to said bottom surface of said trench in said portion inside said trench located in said region for said gate electrode portion to be formed;

a control gate electrode formed at least on an upper surface of part of said second gate insulating film covering at least said one side surface of said floating gate electrode, said other part of said bottom surface of said trench and said other side surface of said trench in said portion inside said trench located in said region for said gate electrode portion to be formed; and a second impurity diffusion layer region of the second conductivity type formed in said underlying layer, extending inward from said main surface of said underlying layer, and being adjacent to said first gate insulating film.

2. The semiconductor memory device of claim 1, wherein said upper surface of said floating gate electrode extends to said main surface of said underlying layer, said control gate electrode is also formed on a portion of said upper surface of said second gate insulating film provided on said upper surface of said floating gate electrode, and none of said first gate insulating film, said second gate insulating film and said control gate electrode is formed on said main surface of said underlying layer outside said trench.

3. The semiconductor memory device of claim 2, wherein said first impurity diffusion layer region is formed immediately below said bottom surface of said trench and further formed in another portion of said underlying layer below said second impurity diffusion layer region.

4. The semiconductor memory device of claim 1, wherein said upper surface of said floating gate electrode and an upper surface of said control gate electrode are formed to a higher level in height than said main surface of said underlying layer, said upper surface of said control gate electrode and said upper surface of said second gate insulating film provided on said upper surface of said floating gate electrode are at the same level in height from said main surface of said underlying layer, and said first gate insulating film, said second gate insulating film, said floating gate electrode and said control gate electrode extend from said trench over said main surface of said underlying layer outside said trench along said first direction.

5. A semiconductor memory device, comprising:

a trench formed in an underlying layer, extending inward from a main surface of said underlying layer;

a gate insulating film formed inside said trench so as to divide a space inside said trench in half; and two gate electrodes formed inside said trench so as to be opposed to each other with said gate insulating film therebetween.

6. The semiconductor memory device of claim 5, wherein one of said two gate electrodes is formed extending over said trench from the inside thereof so as to cover the other gate electrode.

* * * * *